(12) United States Patent
Miyai

(10) Patent No.: US 6,362,506 B1
(45) Date of Patent: Mar. 26, 2002

(54) MINIMIZATION-FEASIBLE WORD LINE STRUCTURE FOR DRAM CELL

(75) Inventor: Yoichi Miyai, Kodaira (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/378,818

(22) Filed: Aug. 23, 1999

Related U.S. Application Data

(60) Provisional application No. 60/098,190, filed on Aug. 26, 1998.

(51) Int. Cl.[7] .................. H01L 29/76; H01L 29/94; H01L 31/062; H01L 31/113; H01L 31/119

(52) U.S. Cl. .................. 257/330; 257/332; 257/401; 257/618

(58) Field of Search ................ 257/288, 296, 257/330, 331, 332, 333, 401, 452, 618; 438/259, 270

(56) References Cited

U.S. PATENT DOCUMENTS 5,614,749 A * 3/1997 Ueno ..................... 257/330
6,168,996 B1 * 1/2001 Numazawa et al. ....... 438/270
6,180,979 B1 * 3/2001 Hofmann et al. ......... 257/329

* cited by examiner

Primary Examiner—Olik Chaudhuri
Assistant Examiner—Hoai Pham
(74) Attorney, Agent, or Firm—W. James Brady, III; Frederick J. Telecky, Jr.

(57) ABSTRACT

A word line structure for a dynamic random access memory (DRAM) cell comprises a generally planar substrate and a plurality of mesa-shaped active regions formed on the substrate and protruding outwardly a given distance therefrom. Each of the mesa-shaped active regions has two word-line-receiving regions formed within it. A plurality of substantially straight and parallel word lines are also included; two of the plurality of word lines are embedded in the two word-line-receiving regions formed in each of the mesa-shaped active regions. The inner surfaces of the word lines are located inwardly of the outer surfaces of the mesa-shaped active regions. The structure further includes an insulation layer positioned on the substrate and which forms a plurality of isolation regions between the plurality of mesa-shaped active regions. At a given boundary formed by a given one of the active regions, isolation regions, and word lines, the outer edges of the isolation regions are located outwardly from the floor portions of the word line regions which are formed in the outer surfaces of the mesa-shaped active regions.

8 Claims, 29 Drawing Sheets

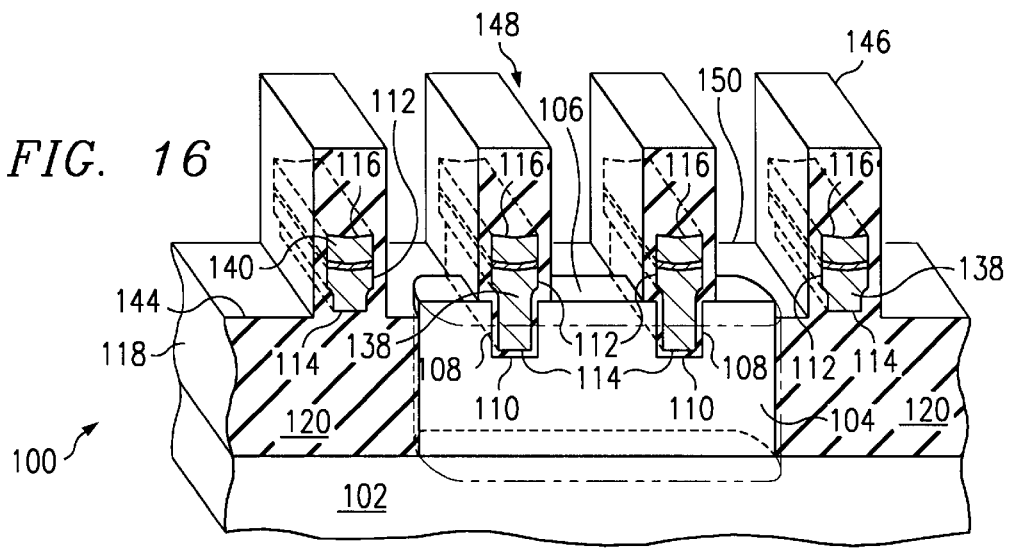
FIG. 16
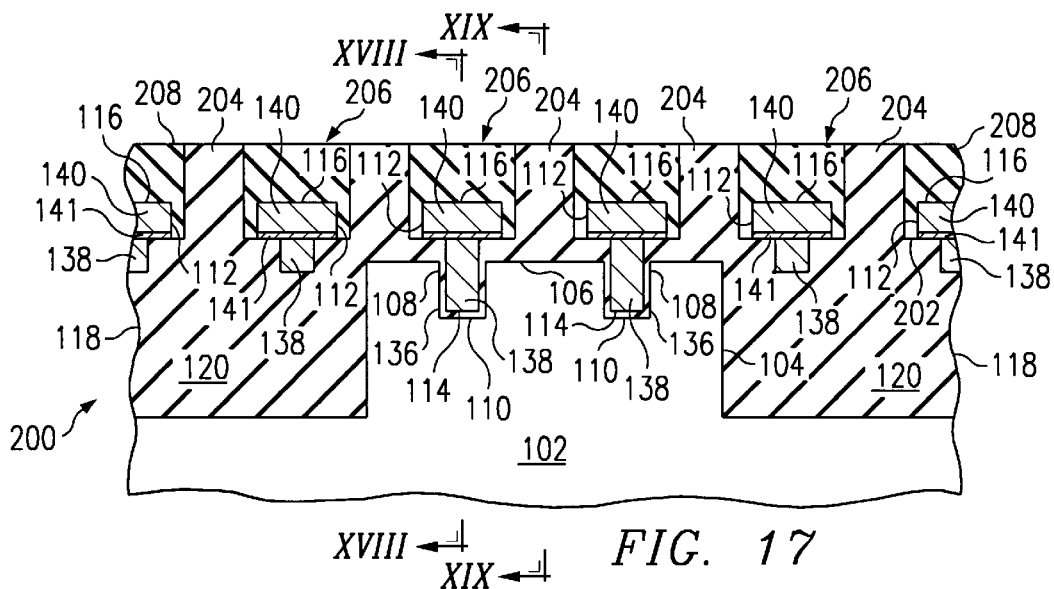
FIG. 17
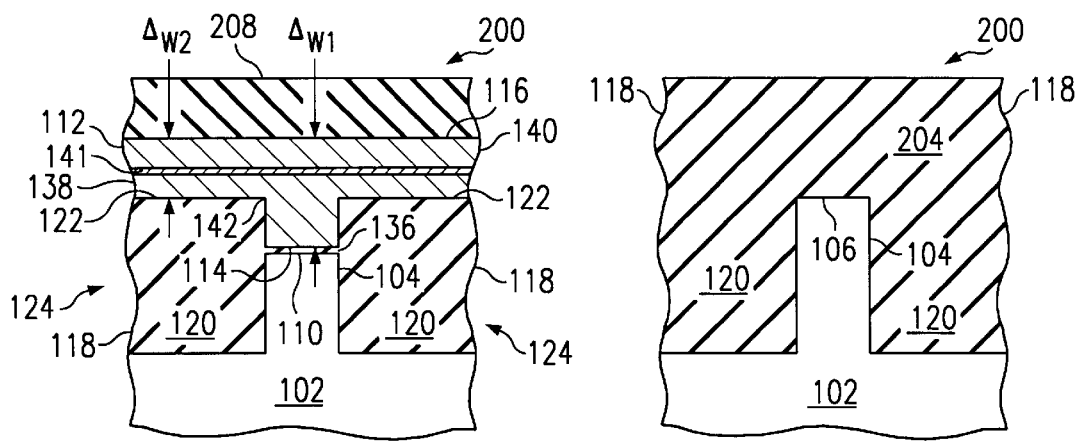
FIG. 18
FIG. 19

MINIMIZATION-FEASIBLE WORD LINE STRUCTURE FOR DRAM CELL

This is a provisional of Application No. 60/098,190 filed Aug. 26, 1998.

TECHNICAL FIELD OF THE INVENTION

This invention relates generally to dynamic random access memory (DRAM) cell devices and particularly relates to a minimization-feasible word line structure for such devices and a method of manufacturing the same.

BACKGROUND OF THE INVENTION

Continued growth in the capacity of dynamic random access memory (DRAM) technology can be enhanced by minimizing the size of individual DRAM cells. Such minimization has been hampered in prior devices and methods for a number of reasons. It has been difficult to fabricate prior devices with straight word lines; it has been difficult to maintain isolation when the DRAM cell size is reduced in cases where the bit line contact (BLCT) and storage node contact (SNCT) are not formed by a process which self-aligns them to the word lines; and it has been difficult to straighten both the active region and the bit lines at the same time in the cell over bit line (COB) type of cell.

In prior devices and methods, two typical structures have generally been employed in forming word lines for DRAM cells. In the first of these, the BLCT and the SNCT are not formed by a self-aligned process to the word lines. Such prior art structures are depicted in FIGS. 1–4. With reference to FIG. 1, a first prior art structure, designated generally as 10, includes a plurality of substantially straight word lines 12 and a plurality of bit lines 14 orthogonal to the word lines 12. The structure also includes a plurality of storage node contacts 16, bit line contacts 18, and active regions 20. A cross section through structure 10 is depicted in FIG. 2. FIG. 2 shows the relationship of the word lines 12, bit lines 14, SNCTs 16 and BLCTs 18 to an insulator 22 and a LOCOS 24. In viewing FIG. 2, it will be appreciated that the word lines 12 are not self-aligned to either the SNCTs 16 or the BLCTs 18.

Still with reference to prior art structure 10, the channel length $L_g$ of the transfer gate must be long enough in order to obtain a sufficient threshold voltage $V_t$. Furthermore, sufficient space is required between the word lines 12, BLCTs 18 and SNCTs 16 so that they do not touch each other. In order to meet these requirements, the length of a unit cell in the cross section perpendicular to the word lines had to become fairly large, thus impeding effective minimization of the structure. In an effort to overcome these problems, an alternative prior art structure, designated generally as 26, was developed. Reference should now be had to FIGS. 3 and 4. As shown in FIGS. 3 and 4, the width of word lines 28 was widened at the transfer gate portion in order to meet the aforementioned requirements; conversely, the remainder of the word lines were narrowed since there was no need for greater width in those regions. This resulted in an irregular shape for the word lines 28 taken in plan view as shown in FIG. 3 and in turn caused large deformations of the actual word line patterns as compared to the mask patterns in the photolithography process. In turn, difficulty was encountered in keeping the width of the word lines 28 constant at the transfer gate portion, thus resulting in a large variation of the threshold voltage $V_t$ for the transfer gates. Further, since it was difficult to control the width of the word lines 28 due to the irregular shape, it was not practical to reduce cell size of the unit cell since the minimum stepper resolution could not be taken advantage of, as is the case for straight word lines.

Note that the remainder of the items depicted in FIG. 3, including the bit lines 14, storage node contacts 16, bit line contacts 18 and active regions 20 have all received the same numbering as in FIGS. 1 and 2.

FIGS. 9 and 10 depict another alternative to the prior art structure, which is designated generally as 30. Word lines 12, SNCTs 16, active regions 20, insulator 22 and LOCOS isolators 24 have received the same numbering as in FIG. 1. Alternative structure 30 includes bit lines 32 and BLCTs 34. It will be appreciated that in prior art structure 30, a portion of the footprint of the BLCT 34 is placed over the isolation region. This can result in degradation of isolation performance between adjacent active regions or leakage from the BLCT 34. The cause was etching off of a portion of the isolation region in the process of etching the hole for the BLCT 34. It will be appreciated that similar problems would be encountered if modification was made to locate part of the SNCT footprint over the isolation region.

FIG. 11 depicts yet another prior art alternative to the structure 10 of FIG. 1, designated generally as 36. The word lines 12, SNCTs 16 and active regions 20 have received the same numbering as in FIG. 1. Bit lines 38 are formed in a completely straight configuration, which is desirable. The BLCTs 40 cross over both the active region and the isolation region, in order to connect to the straight bit lines 38, as depicted for the cell over bit line (COB) configuration of FIG. 11. In theory, the configuration of FIG. 11 can enable minimization of the length of the unit cell in the cross section parallel to the word lines 12. However, in practice, similar problems w ere encountered to those discussed above for the configuration of FIGS. 9 and 10.

Reference should now be had to FIGS. 5 and 6 which depict a prior art structure, designated generally as 42, wherein the BLCTs 44 and SNCTs 46 are formed by a self-aligned process to the word lines 48.

Structure 42 also includes bit lines 50, LOCOS isolation structure 52, and first and second insulators 54, 56 respectively. It will be appreciated that the structure 42 permits use of straight word lines 48 and permits the word lines 48 to be self-aligned to the SNCT 46 and BLCT 44. Unfortunately, the BLCTs 44 and SNCTs 46, although they are self-aligned to the word lines 48, are not self-aligned to the active region. Furthermore, the structure 42 exhibits many of the deficiencies discussed above for the structure 10.

Prior art structures have generally employed two types of isolation. These are the LOCOS isolation method as depicted in FIG. 7 and the trench isolation method as depicted in FIG. 8. As depicted in FIG. 7, in the LOCOS method, a plurality of LOCOS isolators 58 are embedded in the surface 60 of a substrate 62 and extend both inwardly and outwardly therefrom, with the active region 64 formed in between the LOCOS isolators 58.

Reference should now be had to FIG. 8, which depicts a trench isolation structure. A plurality of trench insulators 66 are formed in a substrate 70 are flush with the surface 68 thereof. Active regions 72 are formed between trench insulators 66.

The prior-art trench isolation method depicted in FIG. 8 is prone to a problem with the characteristic of the source to drain current versus the gate voltage. Reference should now be had to FIGS. 12A and 12B, wherein the same reference characters as employed in FIG. 8 are used. Also depicted are word line 74, gate insulator 76 and corner regions 78. A corner region 78 of the active region is formed at the boundary between the active region and the isolation region at trench insulator 66. This occurs when the upper edge of the trench insulator 66 is located below the surface of the active region, as best seen in the detail of FIG. 12B. In this case, an enhanced electric field results in the corner region 78 due to the gate being surrounded by the corner-shaped region. This in turn results in a "kink" on the order of double the threshold voltage $V_t$ in the characteristic source to drain current versus gate voltage. This was due to localized lowering of the threshold voltage $V_t$ in the corner region 78.

SUMMARY OF THE INVENTION

Therefore, a need has arisen in the art for a word line structure for a DRAM cell which will permit effective minimization of the DRAM cell size with straight word lines, effective isolation via self-alignment of the BLCTs and SNCTs to the active region, and with straight active regions and straight bit lines as well. There is also a need for a method of manufacturing such a DRAM word line structure. The present invention provides a word line structure for a DRAM, and a method of manufacturing the same, which substantially reduce or eliminate the aforementioned problems with prior devices and techniques.

In accordance with the present invention, a word line structure for a DRAM cell comprises a generally planar substrate; a plurality of mesa-shaped active regions; a plurality of substantially straight and parallel word lines; and an insulation layer. The plurality of mesa-shaped active regions are formed on the generally planar substrate and protrude outwardly a given distance from the substrate. The active regions have outer surfaces at the given distance from the substrate and each of the outer surfaces has two word-line-receiving regions formed in it. Each of the word-line-receiving regions has a floor portion.

The plurality of substantially straight and parallel word lines each have inner and outer surfaces. Two of the plurality of word lines are embedded in the two word-line-receiving regions formed in the outer surfaces of the mesa-shaped active regions. The inner surfaces of the word lines are located inwardly of the outer surfaces of the mesa-shaped active regions and are adjacent to the floor portions.

The insulation layer is positioned on the substrate and has an insulation layer thickness. The insulation layer forms a plurality of isolation regions between the plurality of mesa-shaped active regions. The isolation regions have outer edges located outwardly from the floor portion of the word-line-receiving regions formed in the outer surfaces of the mesa-shaped active regions at boundary locations. A given boundary is formed by a given one of the mesa-shaped active regions, a given one of the isolation regions, and a given one of the word lines.

More specifically, in one embodiment of the present invention, the insulation layer thickness is such that the insulation layer generally terminates in a main outer surface which is located just inward of the outer surface of the mesa-shaped active regions. In this embodiment, the word line structure further comprises a layer of gate oxide material located between the word lines and the word-line-receiving regions. The gate oxide material is in communication with the insulation layer. Further, the word line structure also further comprises a plurality of finger portions which are integral with the insulation layer and extend outwardly from it. These finger portions enclose the word lines and define a plurality of $Si_3N_4$-receiving cavities therebetween. Finally, in this embodiment, a layer of $Si_3N_4$ is located in the $Si_3N_4$-receiving cavities. The $Si_3N_4$ material is employed because it is an insulator which can be selectively etched with respect to $SiO_2$.

In another embodiment of the present invention, the insulation layer thickness is such that the insulation layer generally terminates in a main outer surface which is located outward of the outer surfaces of the mesa-shaped active regions. The word lines are formed with inner doped polysilicon portions having inner surfaces and outer low resistance portions with outer surfaces. The inner doped polysilicon portions extend outwardly to a level even with the main outer surface of the insulation layer and the insulation layer is formed with a plurality of outwardly extending fingers which extend outward beyond the main outer surface of the insulation layer. The outwardly extending fingers are located between the word lines and form $Si_3N_4$-receiving cavities therebetween. The word line structure of the second embodiment further comprises a layer of gate oxide material located between the word lines and the word-line-receiving regions, with the gate oxide material in communication with the insulation layer, and a layer of $Si_3N_4$ located in the $Si_3N_4$-receiving cavities and surrounding the outer low-resistance portions of the word lines.

In accordance with the present invention, a method of manufacturing a word line structure for a DRAM cell comprises the steps of forming a generally planar substrate; forming a first plurality of $Si_3N_4$ fingers, with a plurality of void regions therebetween; extending the depth of the void regions to form word-line-receiving regions; and placing a plurality of word lines into the word-line-receiving regions. In the step of forming the generally planar substrate, the substrate is formed with a plurality of mesa-shaped active regions protruding outwardly a given distance therefrom. The active regions have outer surfaces at the given distance from the substrate, and the substrate has a layer of insulation formed over it which extends over both the substrate and the active regions. The insulation forms a plurality of isolation regions between the plurality of active regions. The isolation regions have outer edges.

In the step of forming the plurality of $Si_3N_4$ fingers, the fingers are formed on the layer of insulation and extend outwardly from the layer of insulation. The fingers define a plurality of void regions between the fingers and the void regions have a depth which extends inwardly to the layer of insulation.

The step of extending the depth of the void regions includes extending the depth of those regions to form word-line-receiving regions, such that those of the void regions located over the active regions extend into the active regions to form the word-line-receiving regions therein and such that those of the void regions not located over the active regions extend into the layer of insulation to form the word-line-receiving regions therein. The word-line-receiving regions have floor portions and the floor portions of those of the word-line-receiving regions in the mesa-shaped active regions are located inwardly of the outer edge of the isolation regions.

More specifically, in a first method, the step of placing the plurality of word lines can include the sub-steps of applying doped polysilicon into the word-line-receiving regions and then applying a layer of low resistance material over the doped polysilicon. The method can comprise the additional steps of applying a layer of insulation over the low resistance material in the void regions; and removing the $Si_3N_4$ fingers such that the layer of insulation forms a plurality of insulation fingers which extend outwardly and have a width co-extensive with the low resistance material. The insulation fingers define a plurality of interstices therebetween. The method can further comprise the steps of adding additional insulation to enhance the width of the insulation fingers; removing insulation material at inward portions of the interstices to expose the outer surfaces of the active regions where the interstices are adjacent the active regions, and to extend the interstices inward of the outer surfaces of the active regions where the interstices are adjacent the isolation regions. A further step can include filling the interstices with $Si_3N_4$. This method can be used, for example, to manufacture a structure according to the first embodiment discussed above.

In an alternative method, the step of placing the plurality of word lines into the word-line-receiving regions can include the sub-steps of applying doped polysilicon into the word-line-receiving regions and applying a layer of low resistance material over the doped polysilicon for each of the word-line-receiving regions. The layer of low resistance material for each of the word-line-receiving regions can have a width greater than that of its corresponding word-line-receiving region, but sufficiently narrow so as not to touch an adjacent one of the layers of low resistance material. The method can further comprise the additional steps of removing the first plurality of $Si_3N_4$ fingers and then forming a second plurality of $Si_3N_4$ fingers which surround the layers of low resistance material. The second plurality of $Si_3N_4$ fingers terminate at the layer of insulation and in turn form a plurality of insulation-receiving gaps therebetween. Finally, the method can include the step of filling the plurality of insulation-receiving gaps with insulation.

Technical advantages of the present invention include maintenance of an adequate transfer gate length $L_g$ even with narrow word lines; maintaining isolation between the BLCTs, SNCTs and word lines; minimization of unit cell size; and elimination of undesirable "kinks" in the characteristic source-to-drain current versus gate voltage. Further, the present invention can be formed with a low-resolution stepper with reduced manufacturing steps, thus resulting in reduced manufacturing costs.

Other technical advantages of the present invention will be readily apparent to one skilled in the art from the following figures, descriptions, and claims.

BRIEF DESCRIPTION OF THE DRAWINGS

For a more complete understanding of the present invention and the advantages thereof, reference is now be made to the following description taken in conjunction with the accompanying drawings in which like reference numbers indicate like features and wherein:

FIG. 16 is a three-dimensional view of the structure of FIGS. 13–15;

FIG. 17 is a longitudinal cross-sectional view of a second embodiment of word line structure in accordance with the present invention;

FIG. 18 is a transverse cross-sectional view of the structure of FIG. 17 taken at line XVIII—XVIII in FIG. 17;

FIG. 19 is a transverse cross-sectional view of the structure of FIG. 17 taken at line XIX—XIX in FIG. 17;

DETAILED DESCRIPTION OF THE INVENTION

Figure 1:
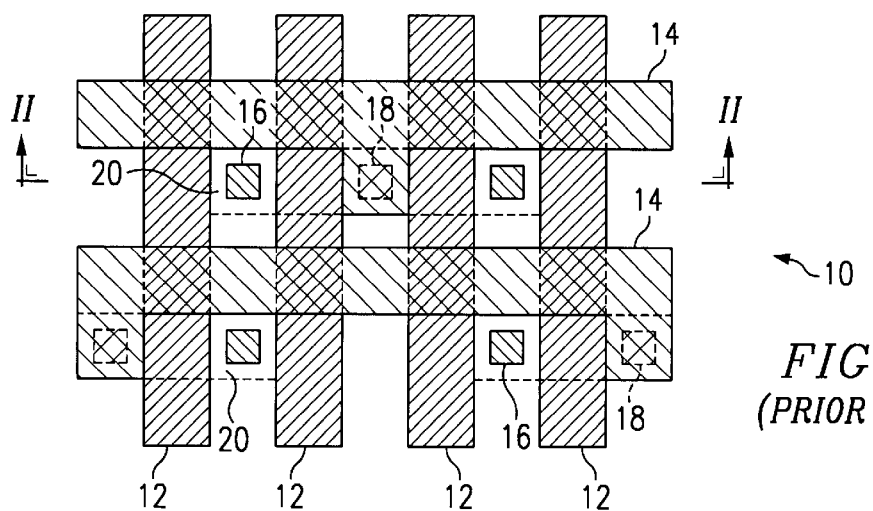
FIG. 1 is a plan view of a prior art word line structure.
Figure 2:
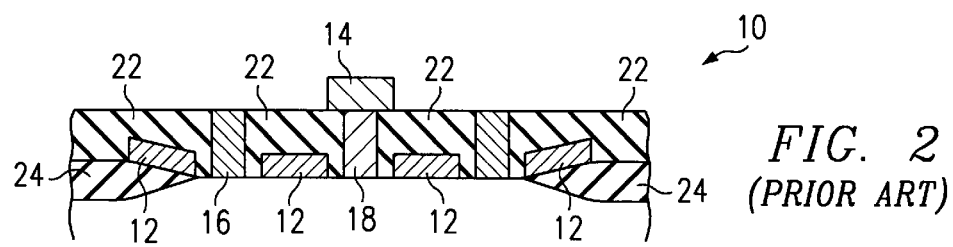
FIG. 2 is a cross-section of the structure of FIG. 1 taken along line II—II.
Figure 3:
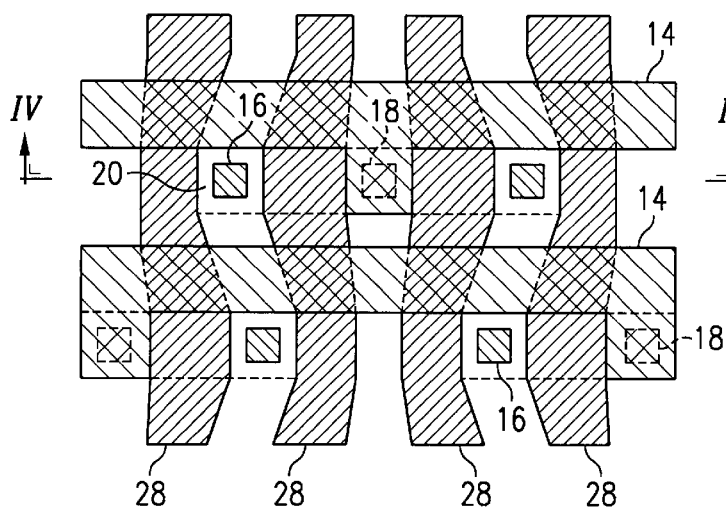
FIG. 3 is a plan view of another prior art word line structure.
Figure 4:
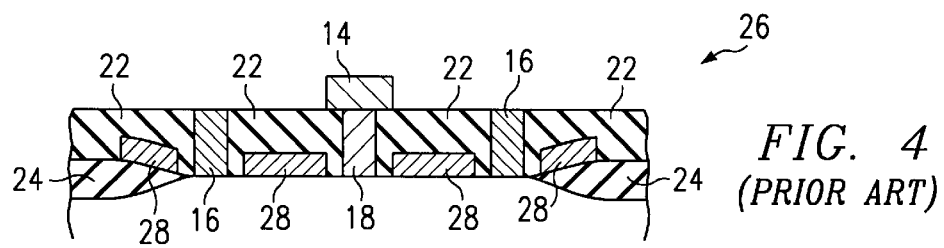
FIG. 4 is a cross-sectional view of the structure of FIG. 3 taken along line IV—IV.
Figure 5:
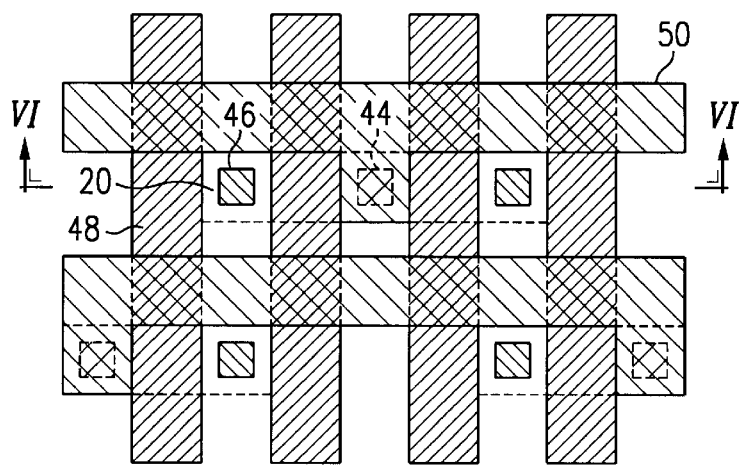
FIG. 5 is a plan view of still another prior art word line structure.
Figure 6:
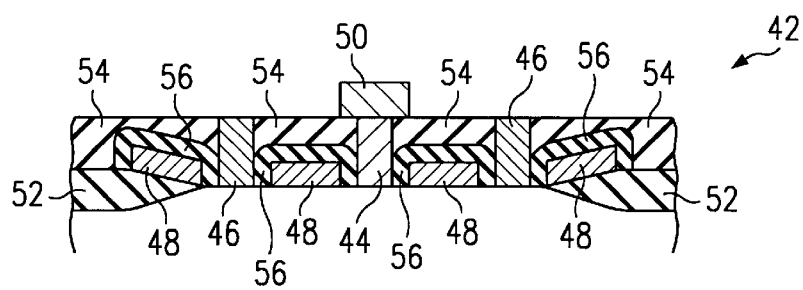
FIG. 6 is a cross-section of the structure of FIG. 5 taken along line VI—VI of FIG. 5.
Figure 7:
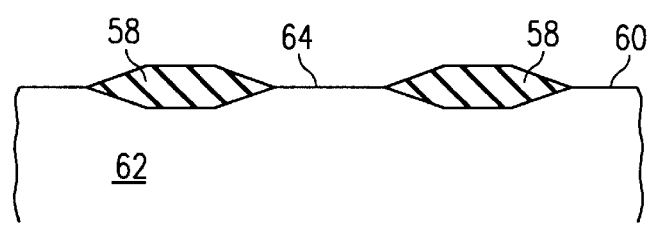
FIG. 7 is a cross-sectional view of a prior art LOCOS isolation structure.
Figure 8:
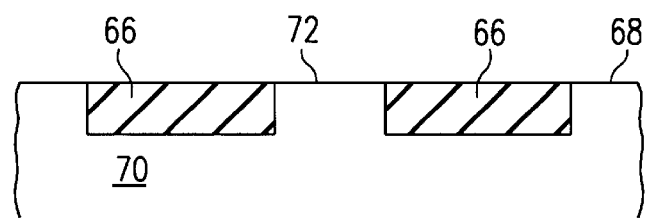
FIG. 8 is a cross-sectional view of a prior art trench isolation structure.
Figure 9:
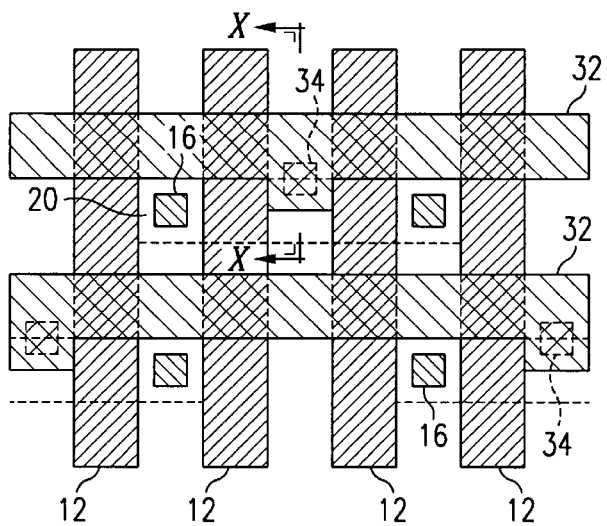
FIG. 9 is a plan view of yet another prior art word line structure.
Figure 10:
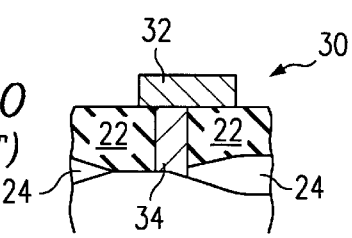
FIG. 10 illustrates a cross-section of the structure of FIG. 9 taken along line X—X.
Figure 11:
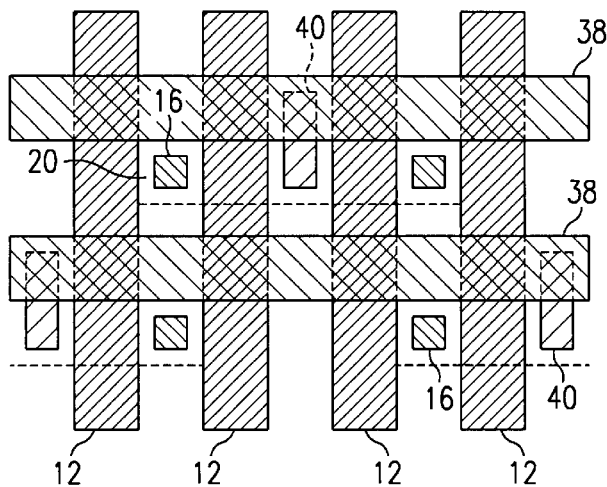
FIG. 11 is still a further prior art word line structure.
Figure 12B:
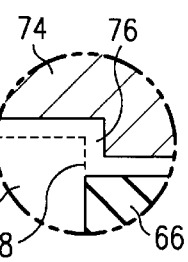
FIG. 12B is a detailed view of the structure of FIG. 12A taken at location XII-B.
Figure 12A:
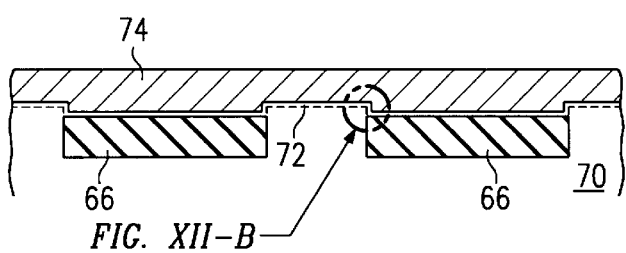
FIG. 12A is a cross-sectional view of a prior art trench isolation structure.
Figure 13:
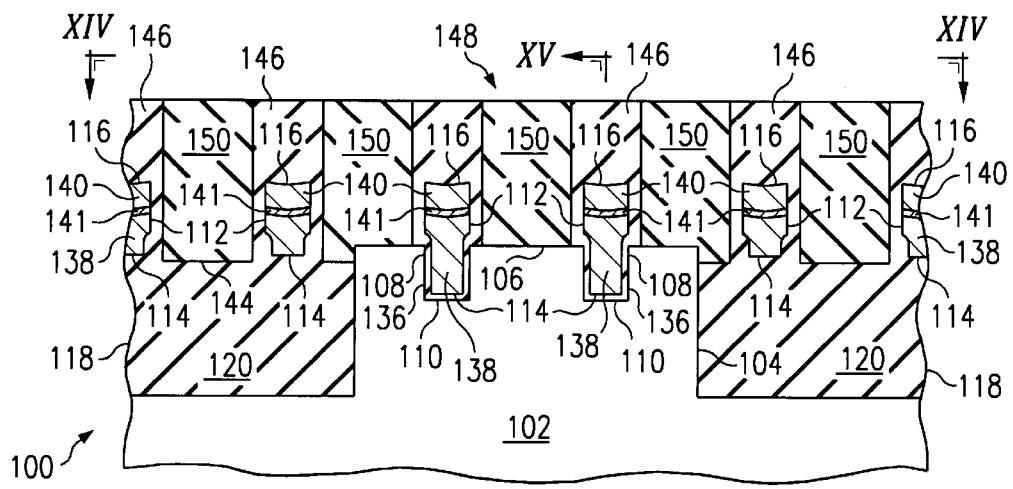
FIG. 13 is a longitudinal cross-sectional view of a first embodiment of word line structure in accordance with the present invention.
Figure 14:
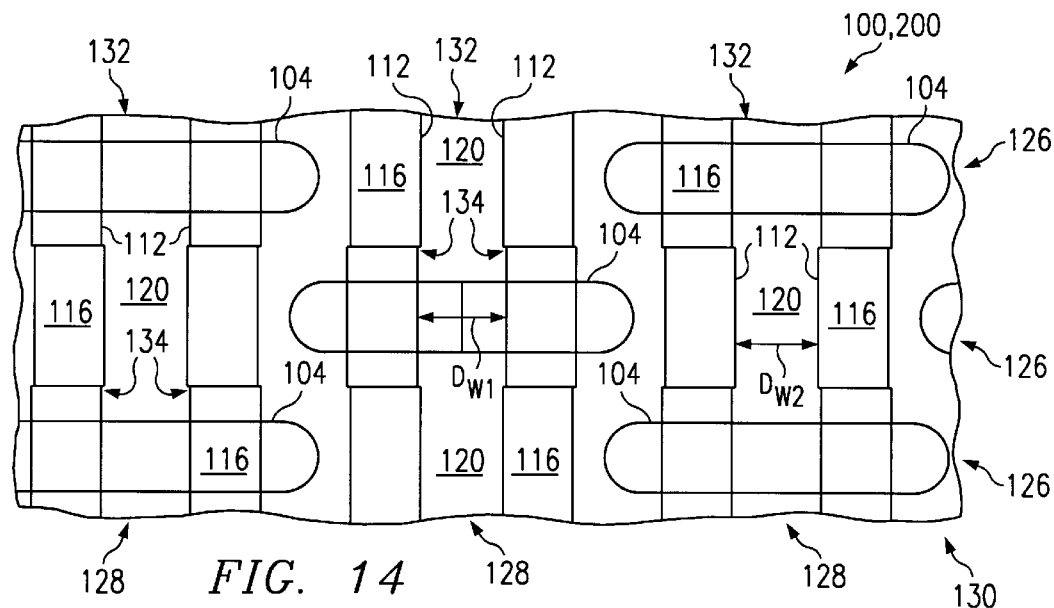
FIG. 14 is a top plan view of the structure of FIG. 13 taken along line XIV—XIV in FIG. 13.
Figure 15:
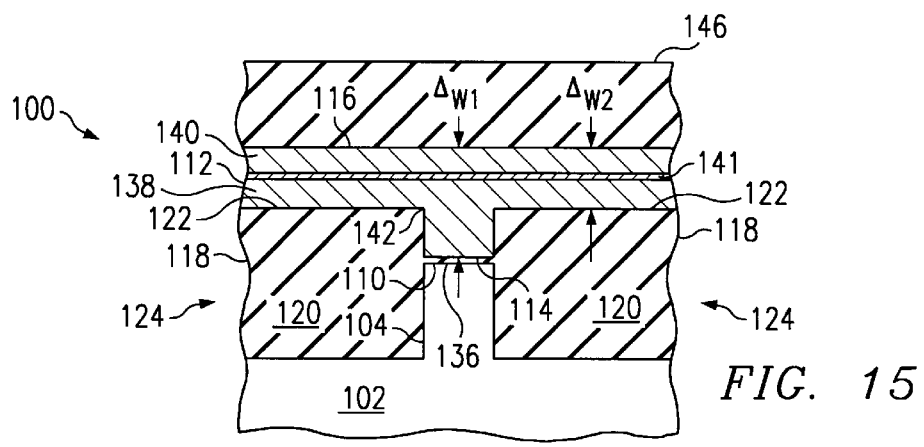
FIG. 15 illustrates a transverse cross-section of the structure of FIG. 13 taken along line XV—XV in FIG. 13.

The word line structure of the present invention will now be described with reference to FIGS. 13–19. FIGS. 13, 15 and 16 depict a first embodiment 100 of the invention, while FIGS. 17–19 depict a second embodiment 200 of the invention. FIG. 14, a top plan view, is essentially the same for both embodiments of the invention. The word line structure 100, 200 includes a generally planar substrate 102. A plurality of mesa-shaped active regions 104 are formed on the substrate 102 and protrude outwardly a given distance therefrom. The mesa-shaped active regions 104 have outer surfaces 106 at the given distance from the substrate 102. Each of the outer surfaces 106 has two word-line-receiving regions 108 formed therein, and each of the regions 108 has a floor portion 110.

Word line structures 100, 200 also further comprise a plurality of substantially straight and parallel word lines 112, each of which has an inner surface 114 and an outer surface 116. Two of the plurality of word lines 112 are embedded in the two word-line-receiving regions 108 formed in the outer surfaces 106 of the mesa-shaped active regions 104, with the inner surfaces 114 of the word lines 112 located inwardly of the outer surfaces 106 of the mesa-shaped active regions 104 and adjacent to the floor portions 110 of the word-line-receiving regions 108. Word line structures 100, 200 also further comprise an insulation layer 118 which is positioned on the substrate 102 and which has an insulation layer thickness. Further details regarding the thickness of insulation layer 118 will be provided below with respect to each of the exemplary embodiments 100, 200. Insulation layer 118 forms a plurality of isolation regions 120 between the plurality of mesa-shaped active regions 104. The isolation regions 120 have outer edges 122 located outwardly from the floor portions 110 of the word-line-receiving regions 108 formed in the outer surfaces 106 of the mesa-shaped active regions 104 at boundaries to be described as follows. The boundaries, designated as 124, are best seen in FIGS. 15 and 18. Boundaries 124 are formed by a given one of the mesa-shaped active regions 104, a given one of the isolation regions 120, and a given one of the word lines 112.

If desired, the word line structure 100, 200 of the present invention can be arranged as illustrated in FIG. 14. More particularly, the plurality of mesa-shaped active regions 104 can be arranged in a pattern of rows 126 and columns 128 on substrate 102 (not separately labeled in FIG. 14) with the word lines 112 running generally perpendicular to the rows 126 and parallel to the columns 128. Each active region 104 in a given row 126 is separated from an adjacent active region 104 in the row 126 by an isolation region 120. Similarly, each active region 104 in a given column 128 is separated from an adjacent active region in the given column 128 by an isolation region 120 such that the rows and columns 126, 128 form a staggered structure designated generally as 130. Further, the word lines 112 can be run in pairs 132 which pass alternatively through individual ones of the mesa-shaped active regions 104 and individual ones of the isolation regions 120. Mesa-shaped active regions 104 can be oblong in plan view as shown in FIG. 14, or can be substantially rectangular or have any other convenient shape.

Close packing can be aided, if desired, by certain additional optional features of the word line structures 100, 200 which will now be described. In particular, the pairs 132 of word lines 112 can be jogged, as shown at jogged areas 134 viewed in the plan view of FIG. 14, such that they are spaced apart a first distance $D_{W1}$ at the mesa-shaped active regions 104 and a second distance $D_{W2}$ at the isolation regions 120. The second distance $D_{W2}$ should be less than the first distance $D_{W1}$ such that adjacent mesa-shaped active regions 104 in a given row 126 can be spaced closer together without touching intermediate pairs 132 of word lines 112 in a given isolation region 120 between the adjacent mesa-shaped active regions 104.

In forming the word line structures of the present invention, such as those exemplified by embodiments 100, 200, a layer of gate oxide material 136 can be located between the word lines 112 and the word-line-receiving regions 108, in communication with the insulation layer 118.

Still with reference to FIGS. 13–19, the word lines 112 of the word line structures, exemplified by embodiments 100, 200 of the present invention can be formed with inner doped polysilicon portions 138 which have the inner surfaces 114 and with outer low resistance portions 140 having the outer surfaces 116. The outer low-resistance portions 140 can be formed, for example, of metal. If desired, a layer of barrier metal 141 can be deposited between inner doped polysilicon portions 138 and outer low resistance portions 140, for example, by sputtering. Further details regarding the method of manufacture will be provided below. In an alternative form of the invention, the portions 138 can be formed of metal; if desired, the same metal as outer portions 140 so that the word lines 112 are substantially unitary metallic structures.

As discussed above, word lines 112 run through both the mesa-shaped active regions 104 and the isolation regions 120. If desired, the word lines 112 can have a first depth $\Delta_{W1}$ over the mesa-shaped active regions 104 and a second depth $\Delta_{W2}$ over the isolation regions 120. Both the first and second depths $\Delta_{W1}$ and $\Delta_{W2}$ extend between the inner and outer surfaces 114, 116 of the word lines 112. The second depth $\Delta_{W2}$ can be made less than the first depth $\Delta_{W1}$ such that the inner surfaces 114 of the word lines 112 jog outwardly at the given boundaries 124, as viewed when moving from a given one of the mesa-shaped active regions 104 to a given one of the isolation regions 120. The outward jog, designated 142, is best seen in FIGS. 15 and 18.

Further details will now be provided with respect to first embodiment 100, with reference to FIGS. 13, 15 and 16. In the embodiment of FIG. 100, the thickness of insulation layer 118 is such that insulation layer 118 generally terminates in a main outer surface 144 which is located just inward of the outer surfaces 106 of the mesa-shaped active regions 104. Embodiment 100 further comprises a layer of gate oxide material 136, as previously discussed, located between the word lines 112 and the word-line-receiving regions 108. As previously noted, the gate oxide material 136 is in communication with the insulation layer 118.

Embodiment 100 further comprises a plurality of finger portions 146 which are integral with the insulation layer 118 and extend outwardly therefrom. The finger portions 146 enclose the word lines 112 and define a plurality of $Si_3N_4$-receiving cavities 148 therebetween. Finger portions 146 can be formed of the same material as insulation layer 118, for example, $SiO_2$. It should be noted that $SiO_2$ can be used for insulation in all the exemplary embodiments of the present invention. First embodiment 100 also comprises a layer of $Si_3N_4$ 150 located in the $Si_3N_4$-receiving cavities.

Further details will now be provided with reference to second embodiment 200 of the inventive word line structure, with reference to FIGS. 17–19. In embodiment 200, the thickness of the insulation layer 118 is such that the insulation layer generally terminates in a main outer surface 202 which is located outward of the outer surfaces 116 of the mesa-shaped active regions 104. In the exemplary embodiment 200 of FIGS. 17–19, the word lines 112 are formed with inner doped polysilicon portions 138 and outer low-resistance portions 140. The inner doped polysilicon portions have the inner surfaces 114 and the outer low-resistance portions have the outer surfaces 116. The inner doped polysilicon portions 138 extend outwardly to a level which is even with the main outer surface 202 of the insulation layer 118. The insulation layer 118 is formed with a plurality of outwardly extending fingers 204 which extend outward beyond the main outer surface 202 of insulation layer 118. The outwardly extending fingers 204 are located between the word lines 112 and form $Si_3N_4$-receiving cavities 206 therebetween. The word lines 112 of second embodiment 200 further comprise a layer of gate oxide material 136 as described above and a layer 208 of $Si_3N_4$ located in the $Si_3N_4$-receiving cavities and surrounding the outer low-resistance portions 140 of the word lines 112.

A method, according to the present invention, of manufacturing the inventive word line structure will now be described. Reference should be had to FIGS. 13–19, as well as to FIGS. 20–51 which depict specific method steps adapted for manufacturing a word line structure corresponding to first embodiment 100 discussed above, and to FIGS. 52–86 which depict method steps especially adapted for manufacturing a second embodiment of word line structure 200 as discussed above. The method of the present invention comprises the steps of (a) forming a generally planar substrate 102 with a plurality of mesa-shaped active regions 104; (b) forming a first plurality of $Si_3N_4$ fingers with void regions therebetween; (c) extending the depth of the plurality of void regions formed in step (b) (as discussed further below) to form word-line-receiving regions; and (d) placing a plurality of word lines 112 into the word-line-receiving regions.

In step (a), the plurality of mesa-shaped active regions 104 protrude outwardly a given distance from the generally planar substrate 102. The mesa-shaped active regions 104 have outer surfaces 106 at the given distance from the substrate 102. The substrate 102 has a layer of insulation 118 formed over it and extending over both the substrate 102 and the mesa-shaped active regions 104. The insulation 118 forms a plurality of isolation regions 120 between the plurality of mesa-shaped active regions 104. The isolation regions 120 have outer edges 122.

Figure 20:
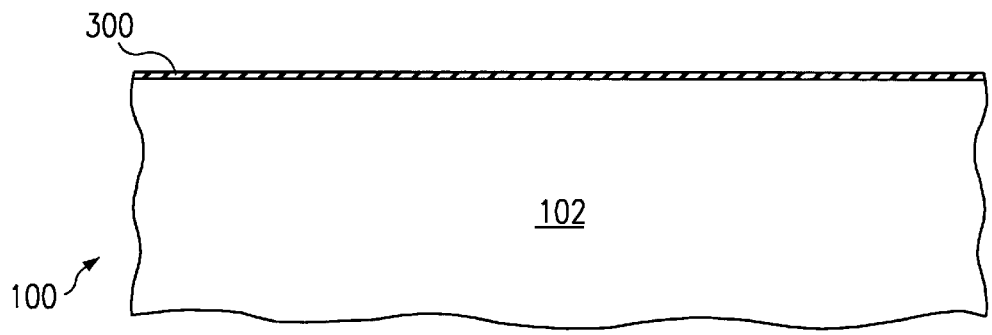
FIGS. 20–51 illustrate steps in a first manufacturing method according to the present invention.
Figure 21:
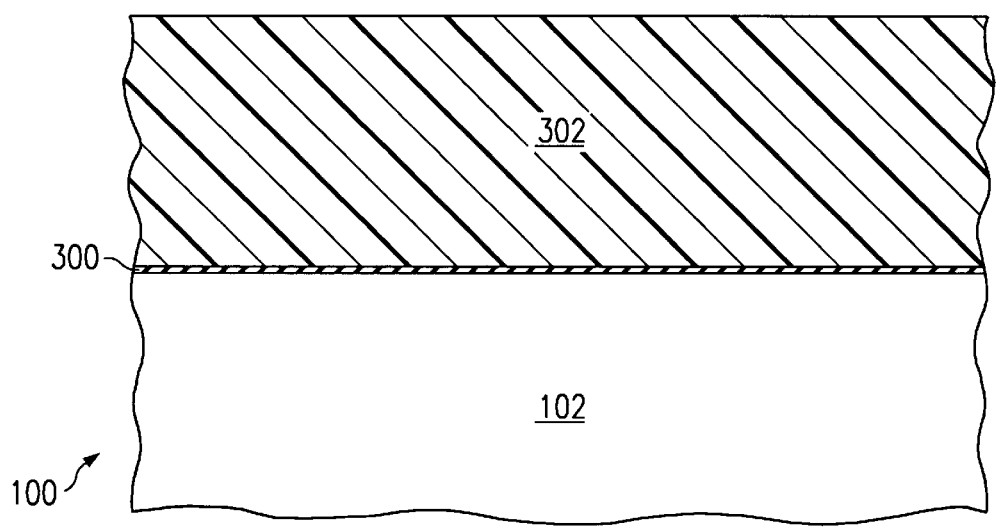
Figure 52:
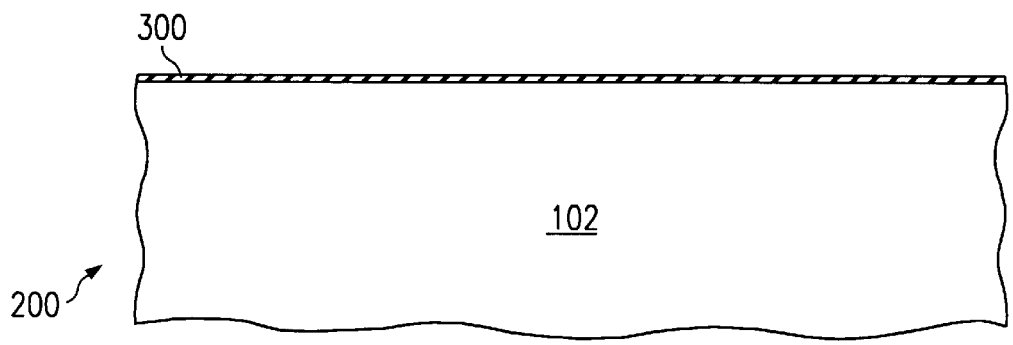
FIGS. 52–86 illustrate method steps in a second manufacturing method according to the present invention.
Figure 53:
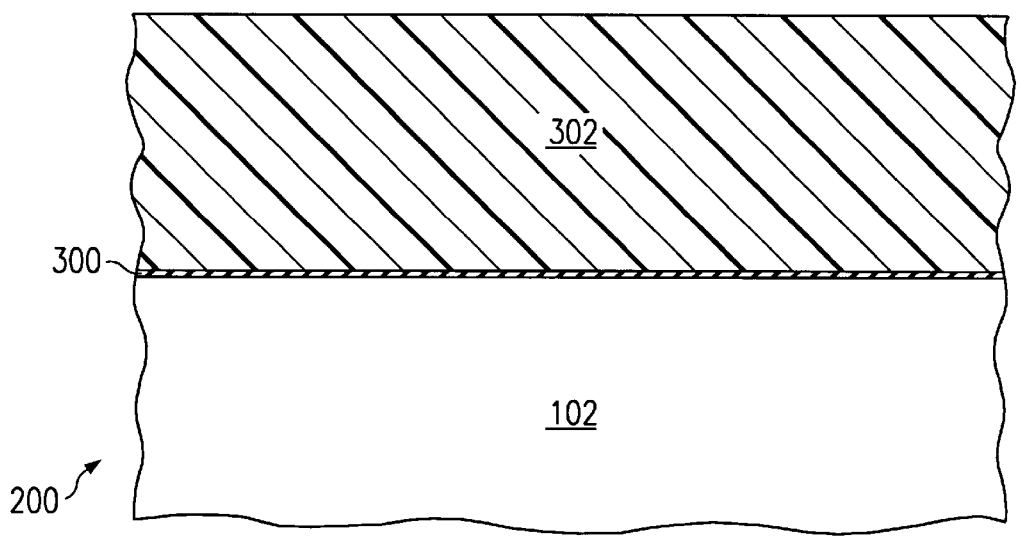

Reference should now be had specifically to FIGS. 20–29 and 52–61 which depict method sub-steps corresponding to step (a) for manufacturing methods adapted to the first embodiment 100 and second embodiment 200 respectively. The sub-steps are essentially identical for the manufacturing methods for both embodiments. Referring to FIGS. 20 and 52, a layer of $SiO_2$ 300 is grown on substrate 102. Referring to FIGS. 21 and 53, a first layer of resist material 302 is coated on top of the $SiO_2$ 300.

Figure 22:
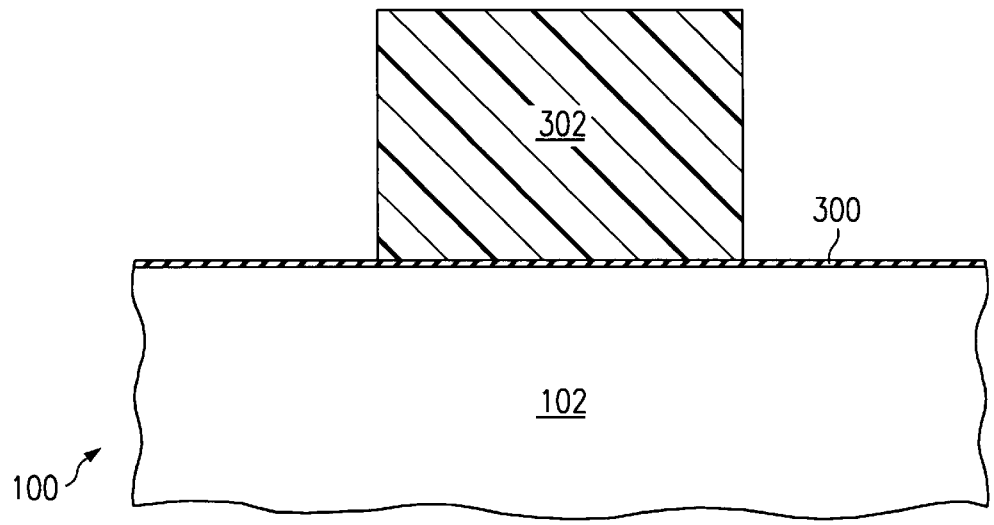
Figure 23:
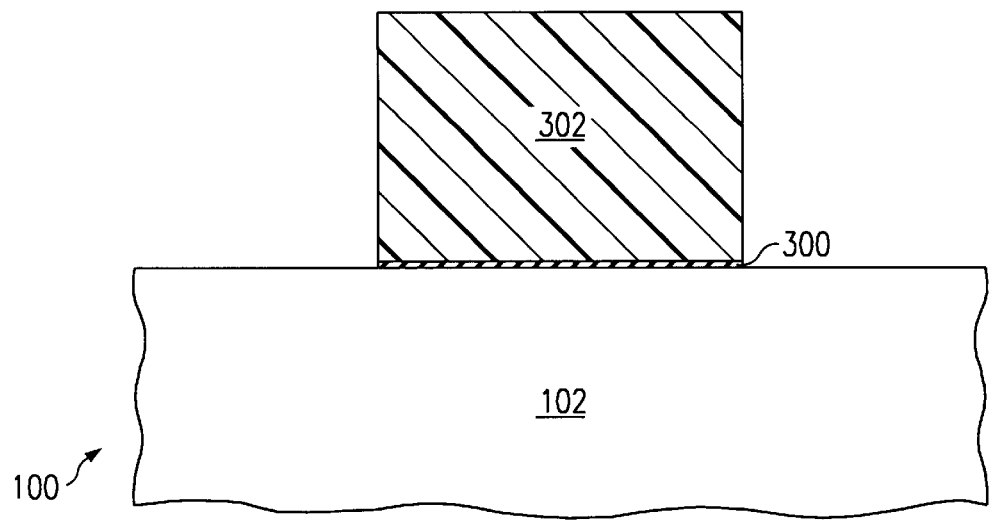
Figure 24:
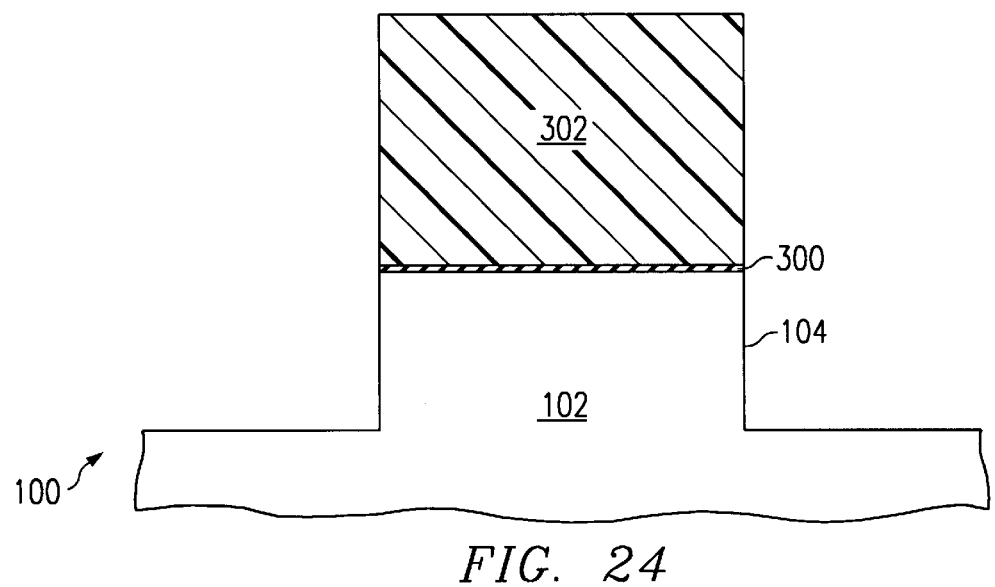
Figure 25:
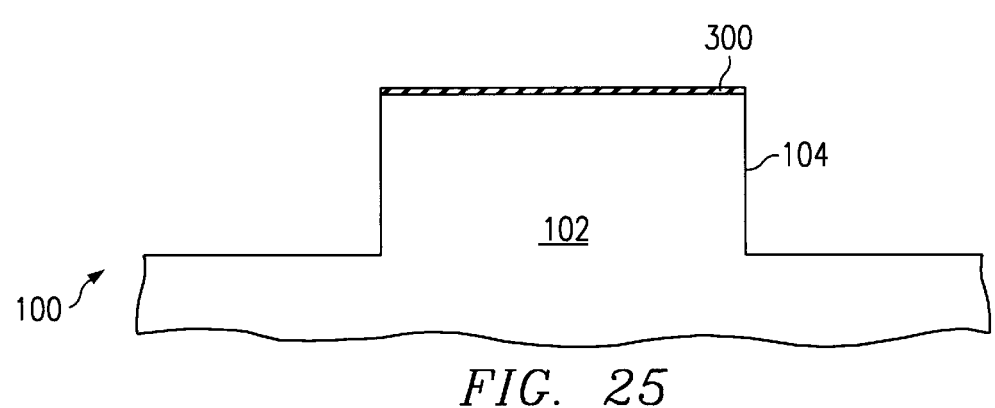
Figure 26:
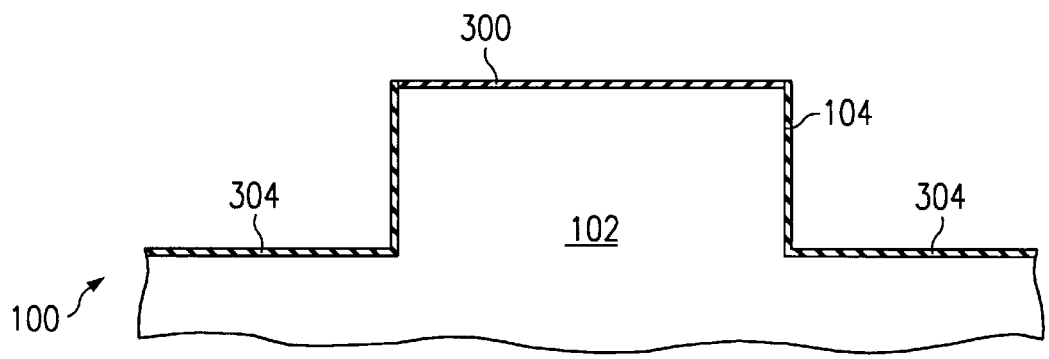
Figure 27:
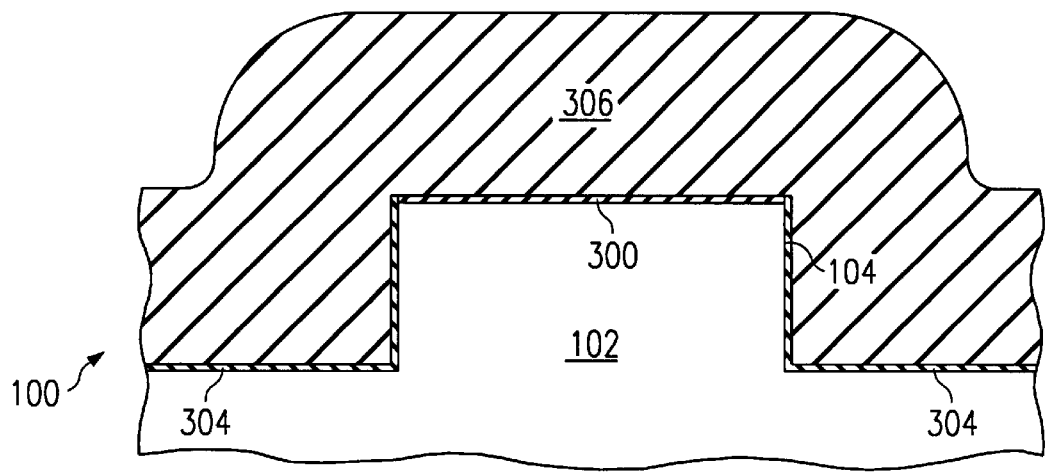
Figure 28:
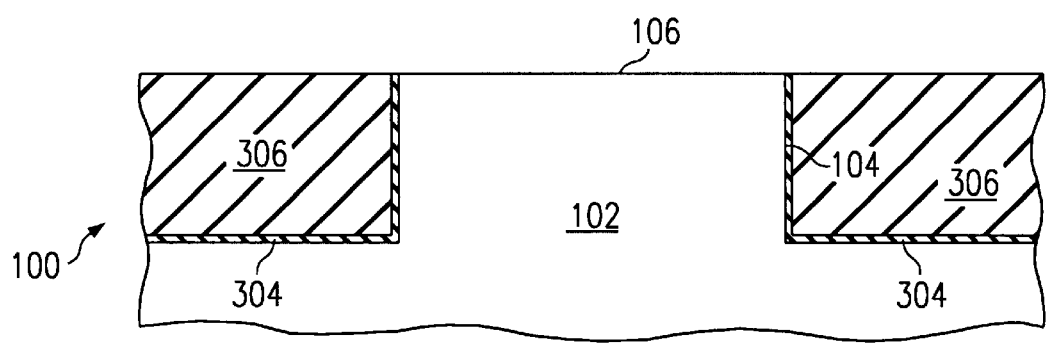
Figure 29:
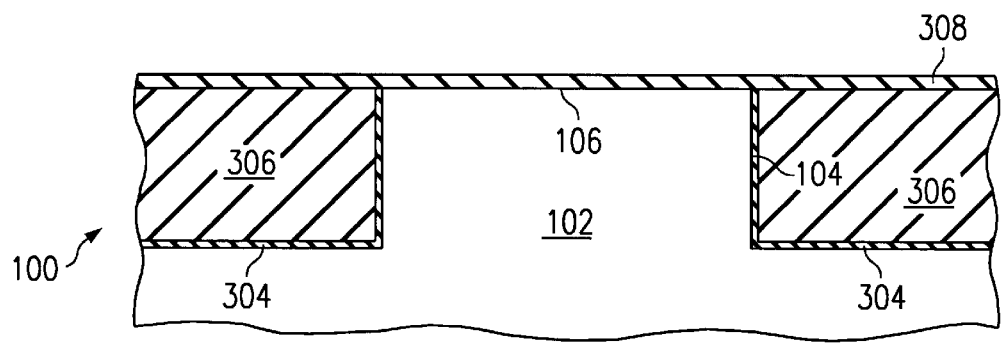
Figure 54:
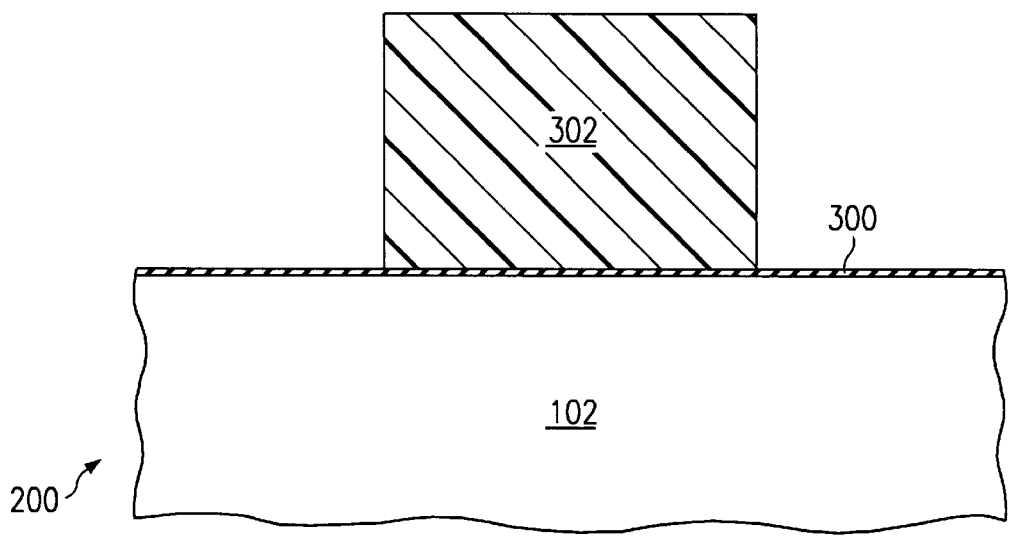
Figure 55:
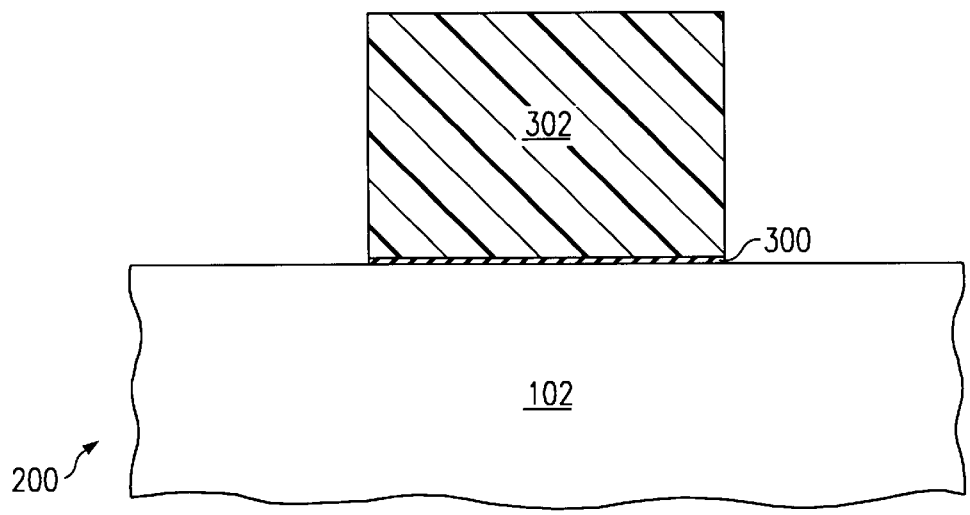
Figure 56:
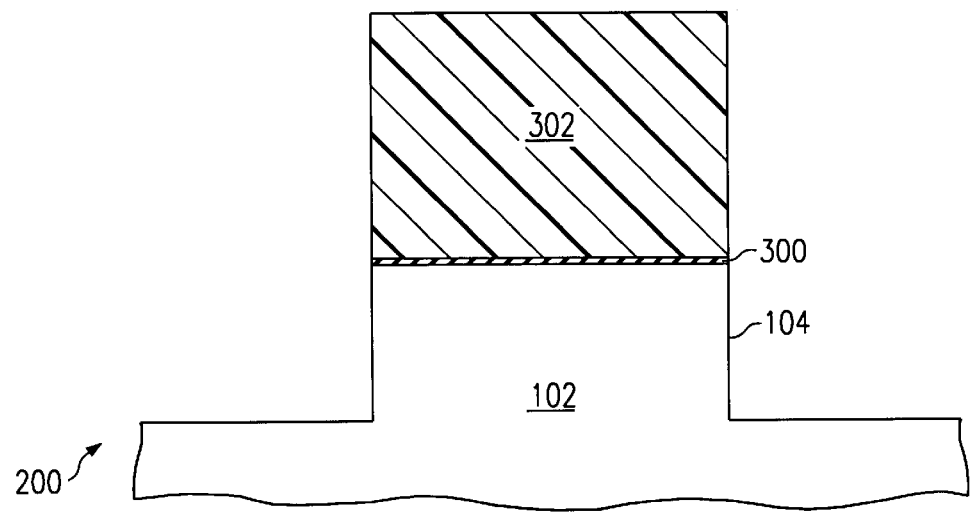
Figure 57:
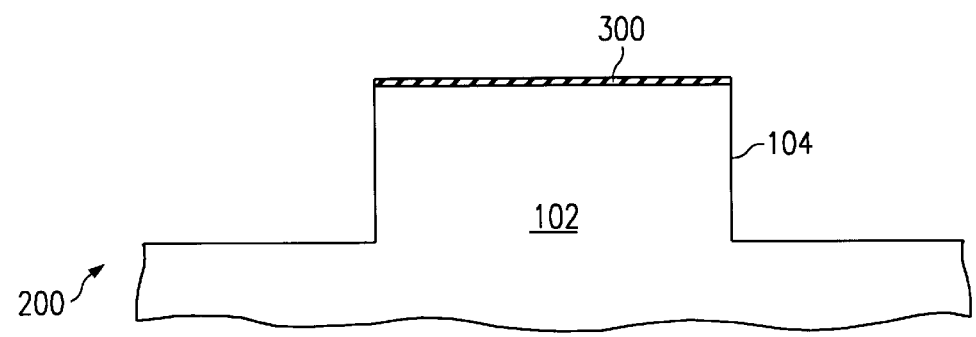
Figure 58:
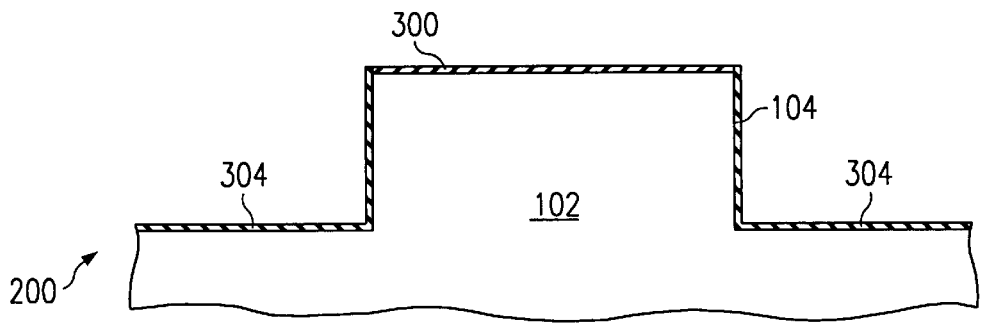
Figure 59:
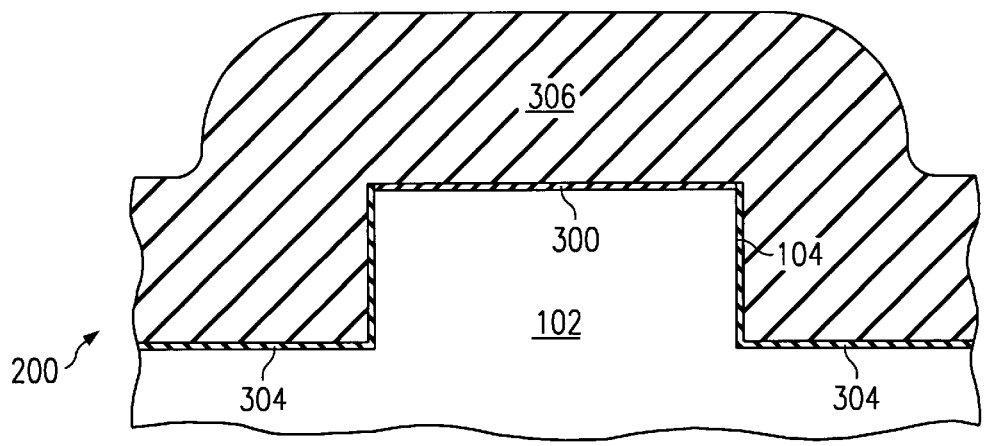
Figure 60:
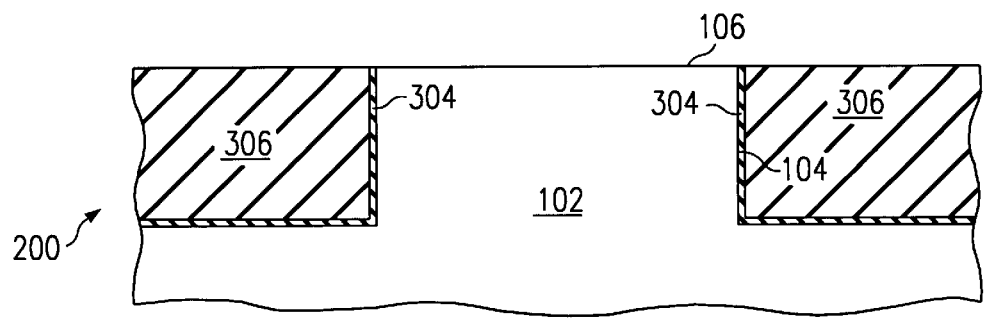
Figure 61:
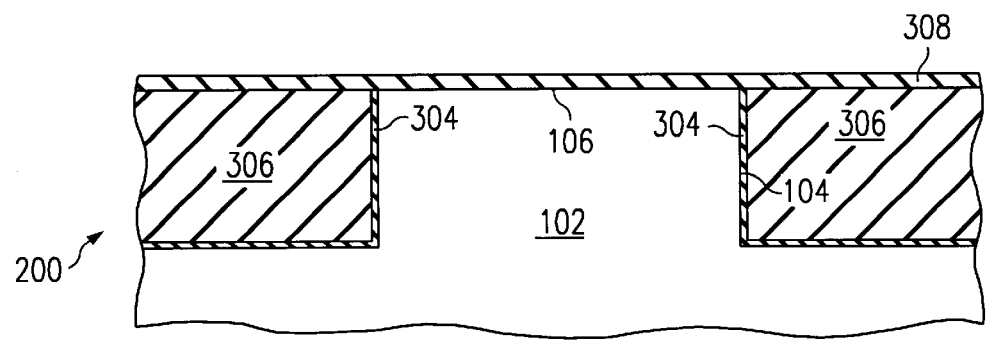

Referring now to FIGS. 22 and 54, the first layer of resist material 302 is patterned using a mask for the active regions 104. Referring to FIGS. 23 and 55, the $SiO_2$ 300 grown onto to the substrate 102 can be etched away in those areas where the first resist layer 302 has previously been patterned away. Then, with reference to FIGS. 24 and 56, substrate 102 can be etched away to leave mesa-shaped active regions 104, under the first resist layer 302 and the grown $SiO_2$ 300. Referring to FIGS. 25 and 57, first resist layer 302 can then be removed. As shown in FIGS. 26 and 58, additional $SiO_2$ 304 can be grown on substrate 102 and the sides of mesa-shaped active regions 104. As shown in FIGS. 27 and 59, a fairly thick layer of $SiO_2$ 306 can be deposited on top of the grown $SiO_2$ 300, 304. A suitable planarization process, such as chemical mechanical polishing (CMP) can then be used to planarize the outward surface such that the thick layer of $SiO_2$ is coextensive with outer surfaces 106 of mesa-shaped active regions 104. This latter sub-step is depicted in FIGS. 28 and 60.

Step (a) can also comprise the additional sub-step of growing additional $SiO_2$ 308 onto the upper planarized surface just created in the previous sub-step. It is to be appreciated that the previously-discussed sub-steps merely represent exemplary fashions is which step (a) of the method can be accomplished.

Figure 30:
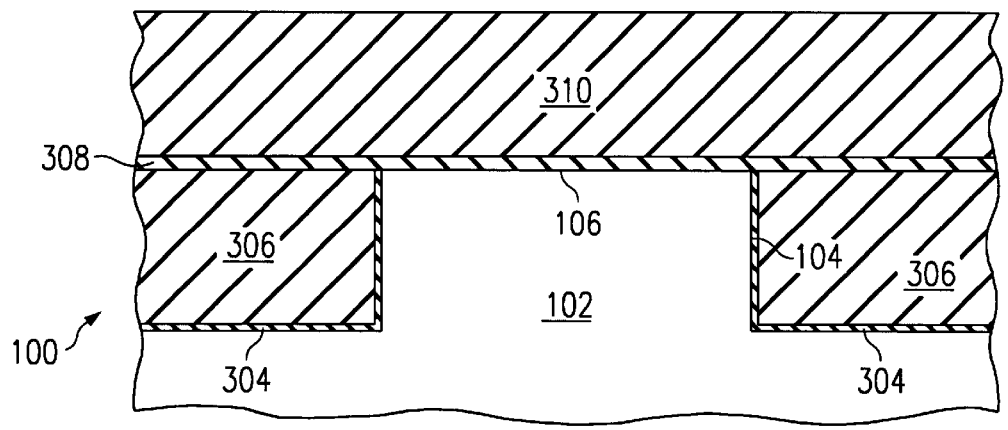
Figure 31:
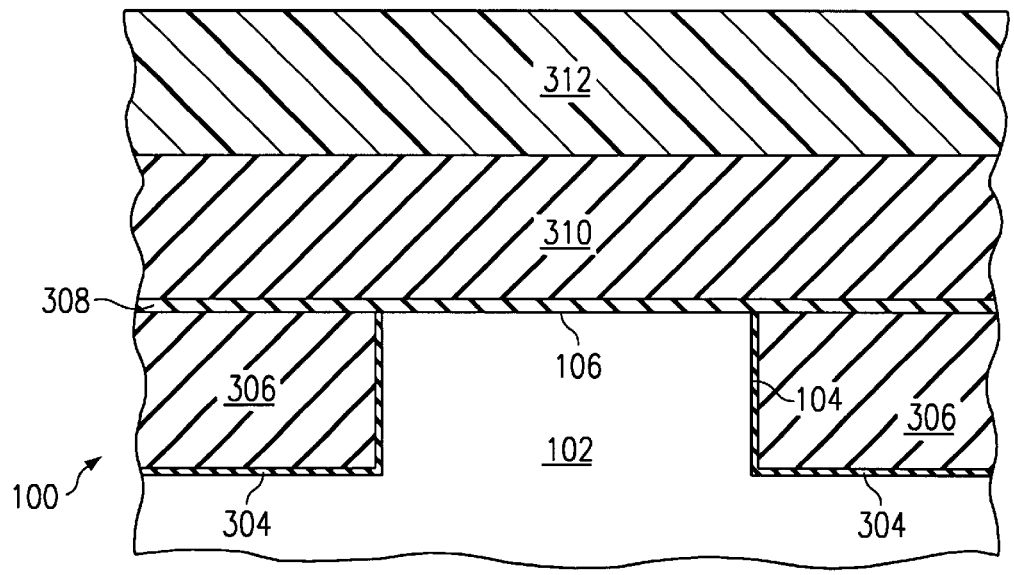
Figure 32:
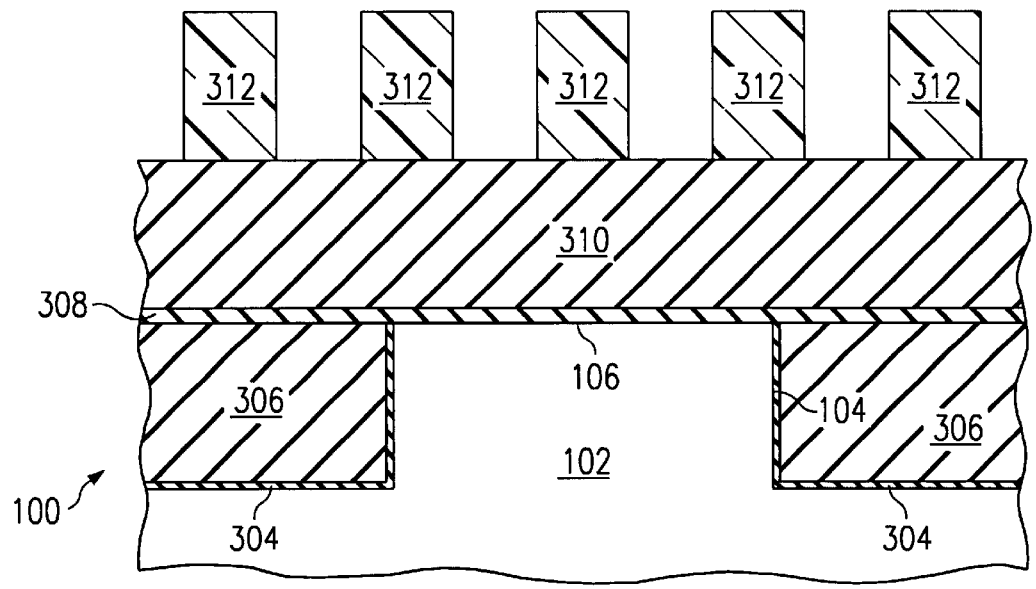
Figure 33:
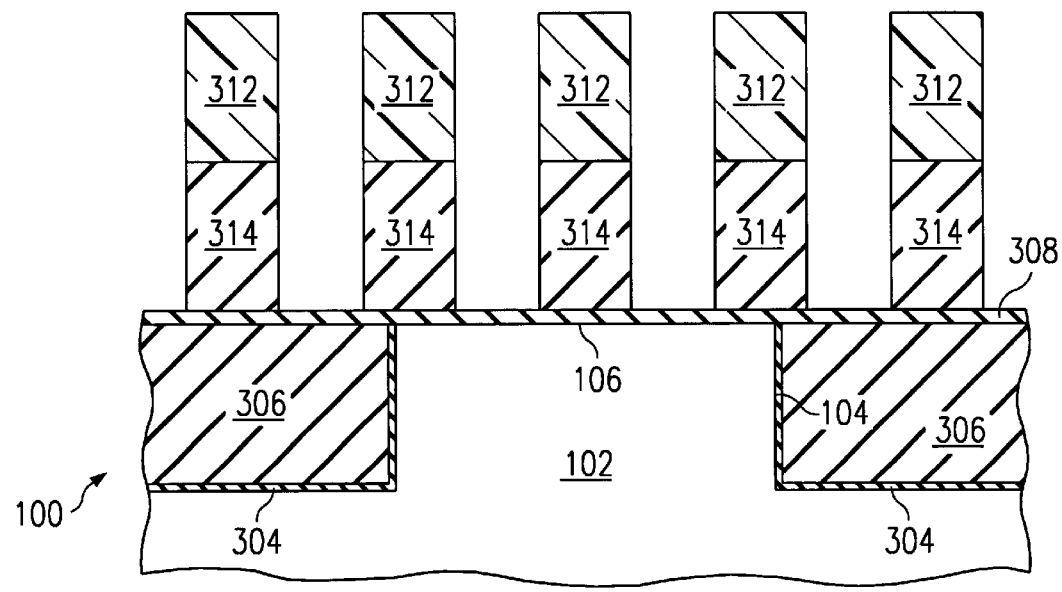
Figure 34:
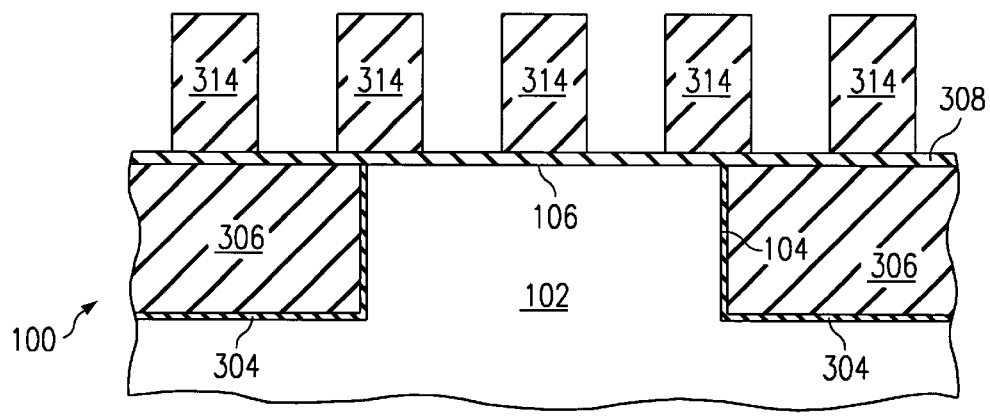

Additional details regarding method step (b) will now be presented. Method step (b) comprises forming a first plurality of $Si_3N_4$ fingers on the insulation layer 118. The fingers extend outwardly from the insulation layer and define a plurality of void regions between themselves. The void regions have a depth which extends inwardly to the layer of insulation. An exemplary manner of performing step (b), suitable for manufacturing the first embodiment of the word line structure 100, will now be discussed. Referring to FIG. 30, a first layer of $Si_3N_4$ 310 can be deposited over the planarized surface. First $Si_3N_4$ layer 310 can then be coated with an additional layer of resist material 312. Referring to FIG. 32, the additional resist layer 312 can be patterned using a mask to form the NOT of the word lines 112 discussed above. By NOT is meant the logical not, i.e., that region where the word lines are not to be formed. The first $Si_3N_4$ layer 310 can then be etched in the regions where the resist 312 has been patterned away, forming a first plurality of $Si_3N_4$ fingers 314. In the regions where the $Si_3N_4$ layer 310 is etched, it can be etched all the way down to the previously-grown layer of $SiO_2$ (or other insulation) 308. With reference to FIG. 34, the resist 312 can be removed.

Figure 35:
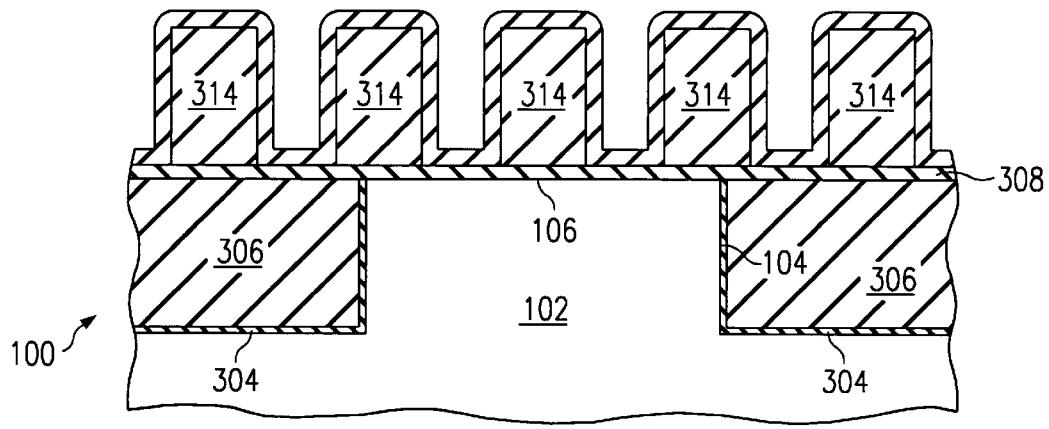
Figure 36:
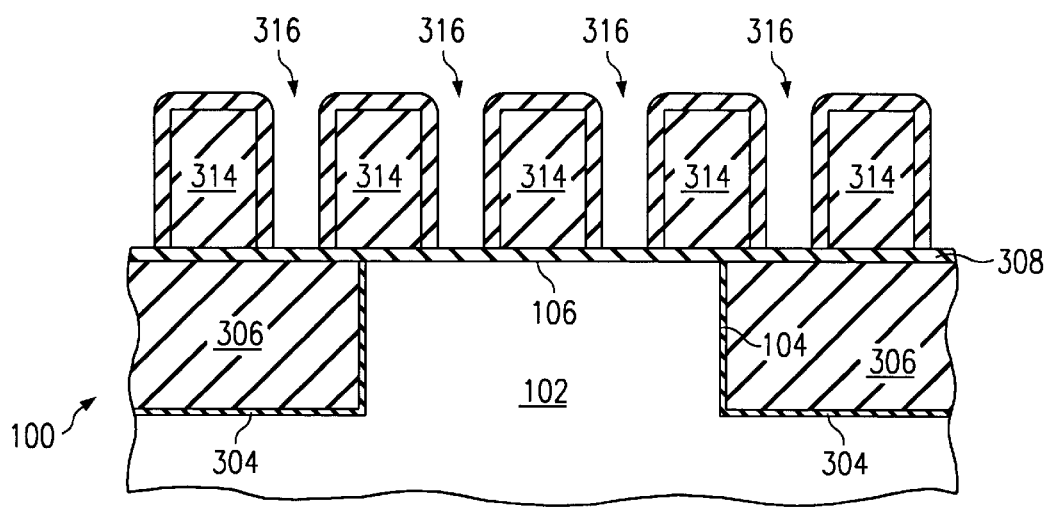
Figure 37:
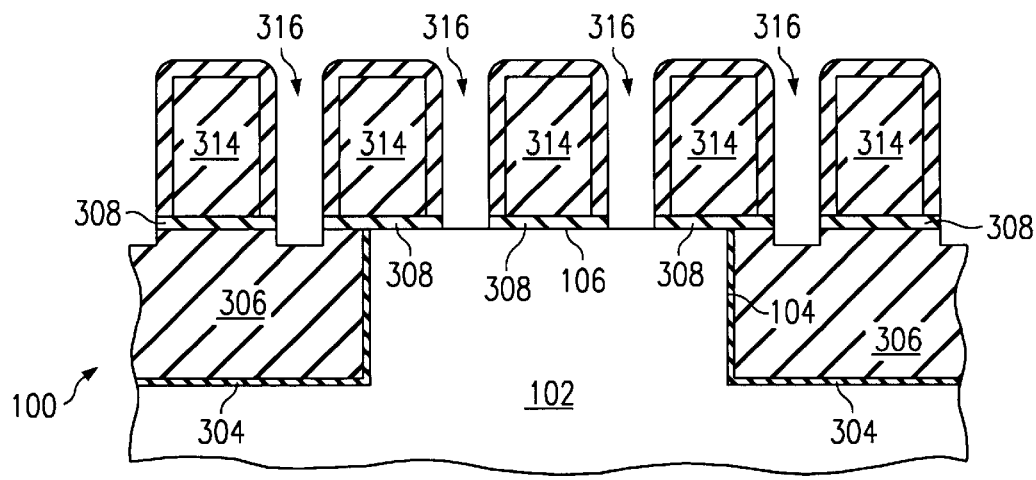

As shown in FIG. 35, the size of the $Si_3N_4$ fingers 314 can be augmented by further deposition of $Si_3N_4$. This will leave an additional layer of $Si_3N_4$ over the $SiO_2$ 308 previously grown. This $Si_3N_4$ can then be etched back, as shown in FIG. 36, so that the first plurality of $Si_3N_4$ fingers 314 extend outwardly from the insulation layer, such as the $SiO_2$ 308, and in turn define a plurality of void regions 316 between fingers 314. Void regions 316 have a depth which extends inwardly to the insulation layer, such as that formed by the $SiO_2$ deposition 308.

Figure 62:
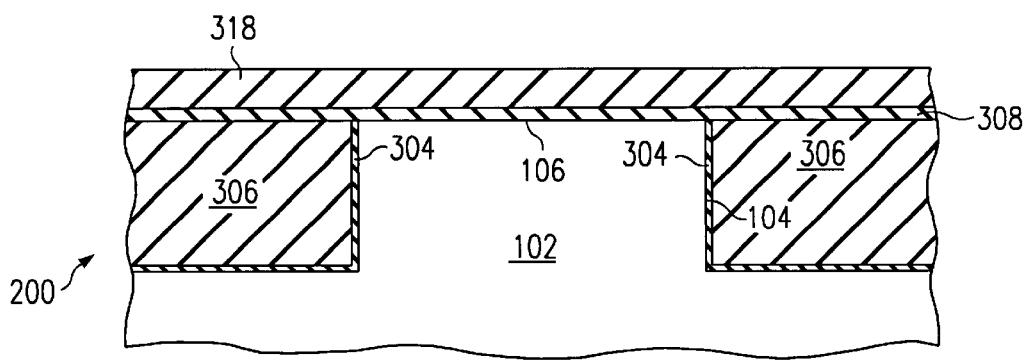
Figure 63:
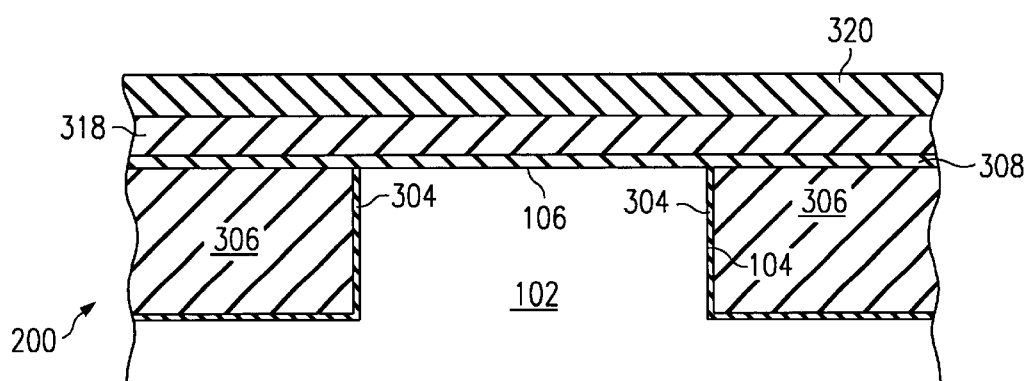
Figure 64:
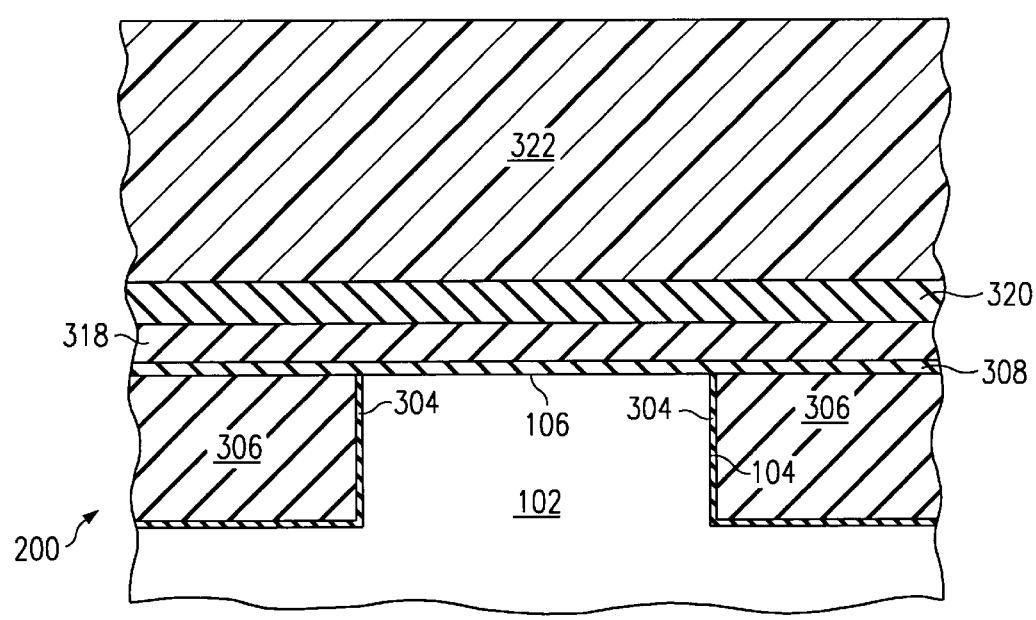

Method step (b) will now be discussed with reference to a method of manufacturing the second embodiment of the invention 200 discussed above. In this case, step (b) can comprise the sub-steps discussed and illustrated below. With reference to FIG. 62, additional $SiO_2$ 318 can be deposited on top of the previously-grown layer 308. Then, an additional layer of $Si_3N_4$ 320 can be deposited on top of the $SiO_2$ layer 318. Referring to FIG. 64, an additional layer of resist material 322 can then be deposited on top of $Si_3N_4$ layer 320.

Figure 65:
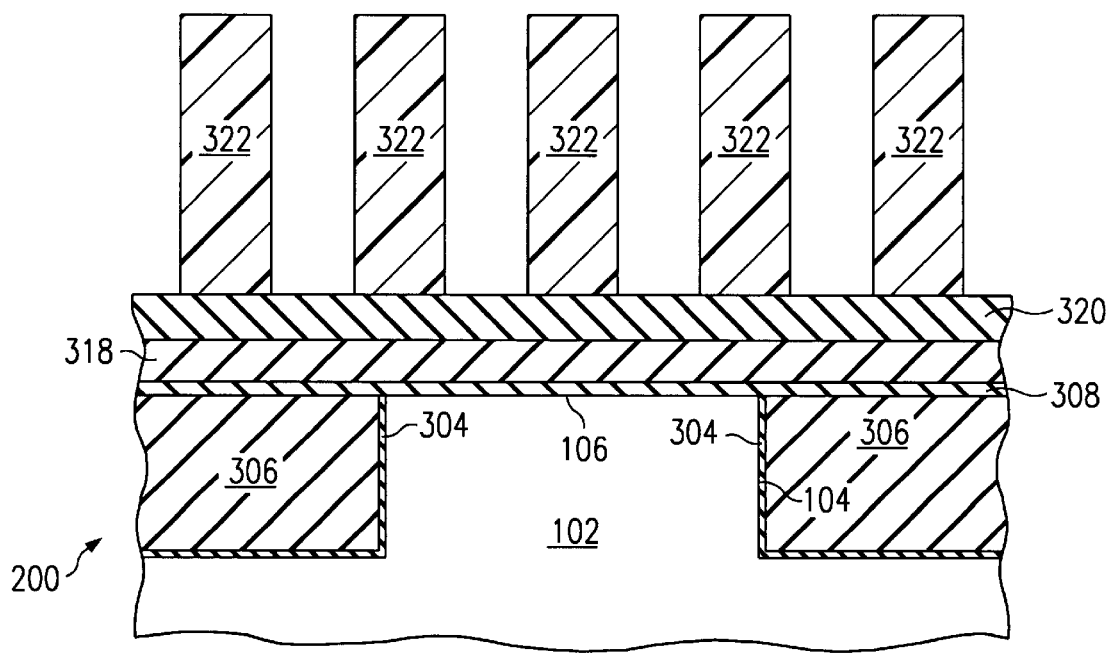
Figure 66:
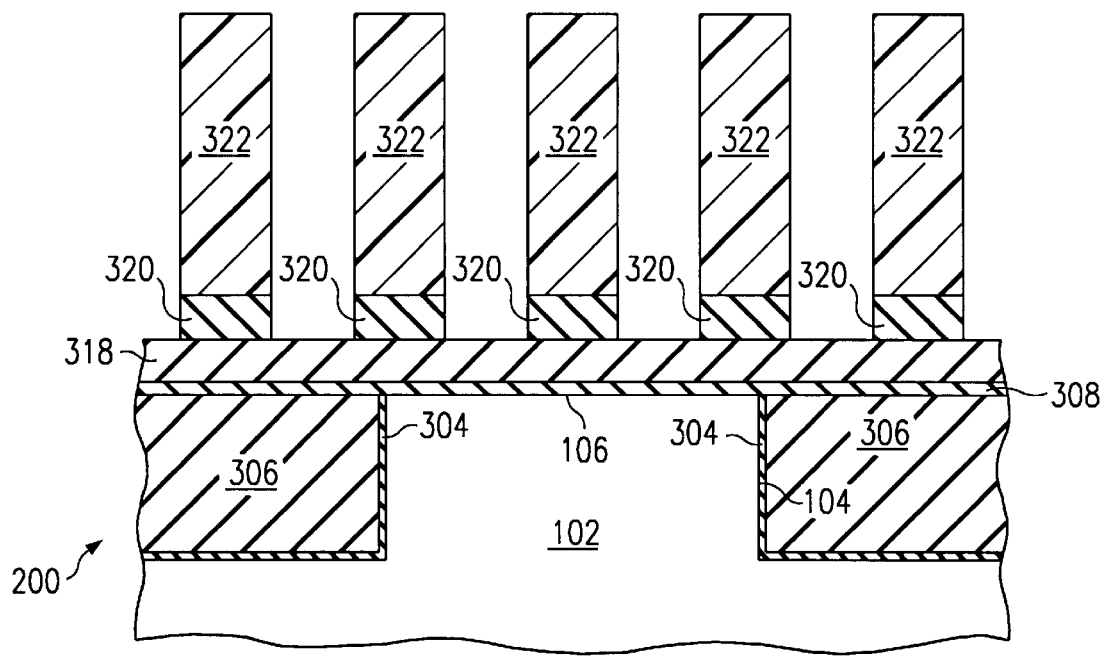
Figure 67:
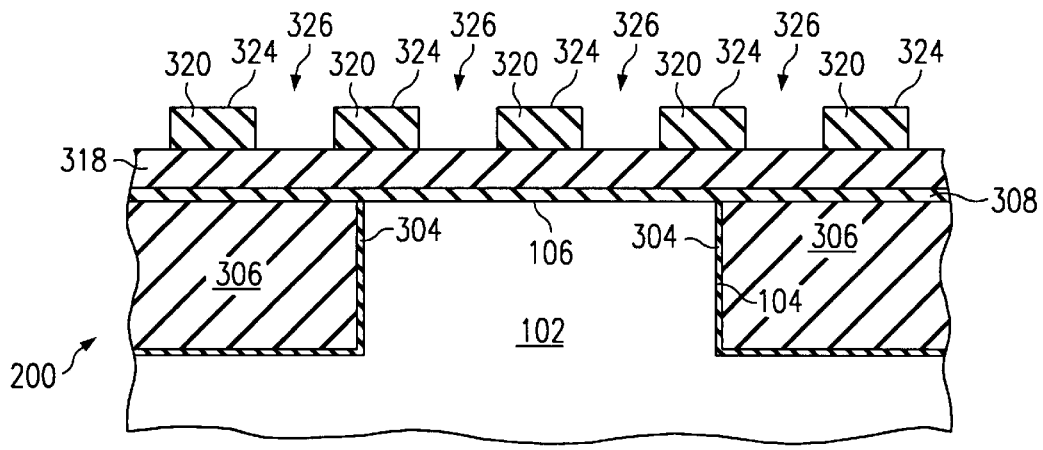

As shown in FIG. 65, resist layer 322 can be patterned using a mask to form the NOT of the word lines 112 discussed above. The $Si_3N_4$ 320 can then be etched back to the $SiO_2$ layer 318 in the regions where the resist 322 has been patterned away, as shown in FIG. 66. The resist 322 can then be removed as shown in FIG. 67. It will be appreciated that the etching of the $Si_3N_4$ 320, as depicted in FIG. 66, results in formation of a first plurality of $Si_3N_4$ fingers 324 and a layer of insulation, such as that formed by $SiO_2$ 318. Fingers 324 are labeled in FIG. 67, and it will be appreciated that a plurality of void regions 326 are defined between fingers 324.

Figure 68:
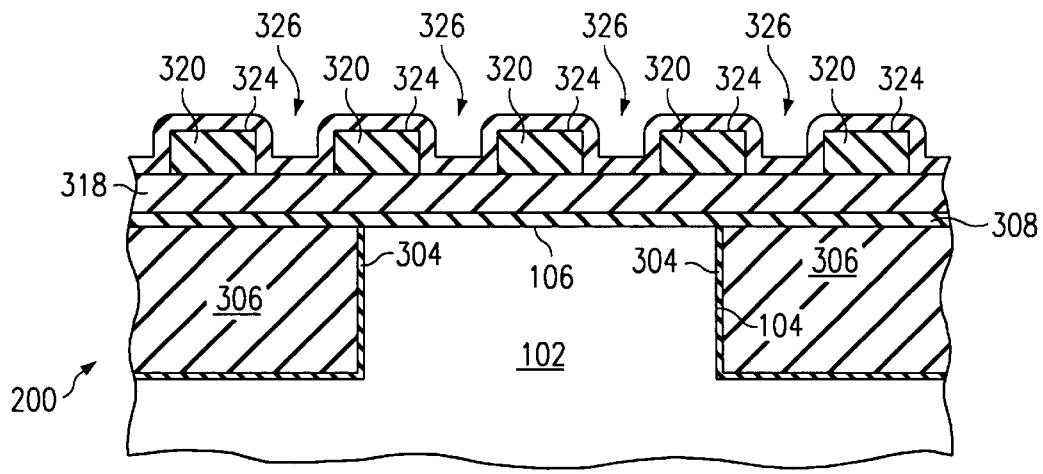
Figure 69:
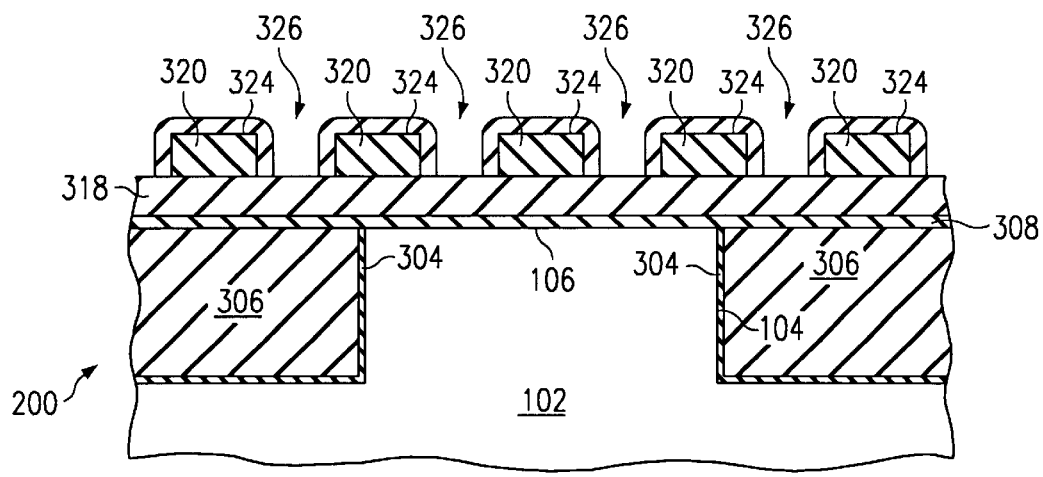

With reference to FIG. 68, fingers 324 can have their size augmented by further deposition of $Si_3N_4$. The $Si_3N_4$ located between the fingers over the $SiO_2$ layer 318 can then be etched back to the $SiO_2$ layer 318, as shown in FIG. 69. The $Si_3N_4$ fingers 324 will thus extend outwardly from the insulation layer, such as $SiO_2$ layer 318 and the void regions 326 will have a depth extending inwardly to the insulation layer, such as $SiO_2$ layer 318.

Method step (c) will now be discussed in further detail. This step can comprise extending the depth of the void regions to form word-line-receiving regions, such that those of the void regions located over the mesa-shaped active regions 104 form the word-line-receiving regions therein, and such that those of the void regions not located over the mesa-shaped active regions 104 extend into the insulation layer 118 to form the word-line-receiving regions therein. The word-line-receiving regions can have floor portions and the floor portions of those of the word-line-receiving regions in the mesa-shaped active regions 104 can be located inwardly of the outer edges 122 of the isolation regions 120.

Figure 38:
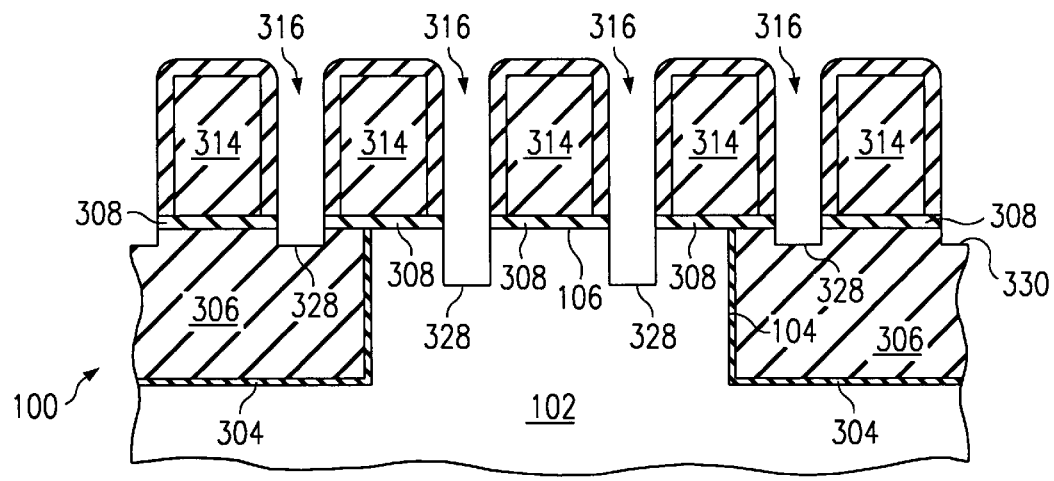

Further details regarding performance of methods step (c) will now be given with respect to a method of manufacturing suitable for the first embodiment 100 of the invention, set forth above. Continuing from the description of FIG. 36 above, and with reference to FIG. 37, $SiO_2$ 308 can be etched such that void regions 316 now extend down to outer surface 106 of mesa-shaped active regions 104 for the void regions 316 located over the active regions 104. Similarly, void regions 316 not located over mesa-shaped active regions 104 can be extended down into the $SiO_2$ somewhat inward of outer surfaces 106 of mesa-shaped active regions 104. Subsequently, as shown in FIG. 38, substrate 102, in the portions of the mesa-shaped active regions 104 which abut the void regions 316, can be etched. The etching can be stopped above the inward portions of the trench isolation regions formed by layer 306. The extended void regions 316 thus produced form the aforementioned word-line-receiving regions over both the mesa-shaped active regions 106 and the layer of insulation, such as $SiO_2$ layer 306. The word-line-receiving regions all have floor portions 328. Floor portions 328 of those of the word-line-receiving regions in the mesa-shaped active regions 104 are located inwardly of the outer edges 330 of the isolation regions formed by layer 306.

Figure 70:
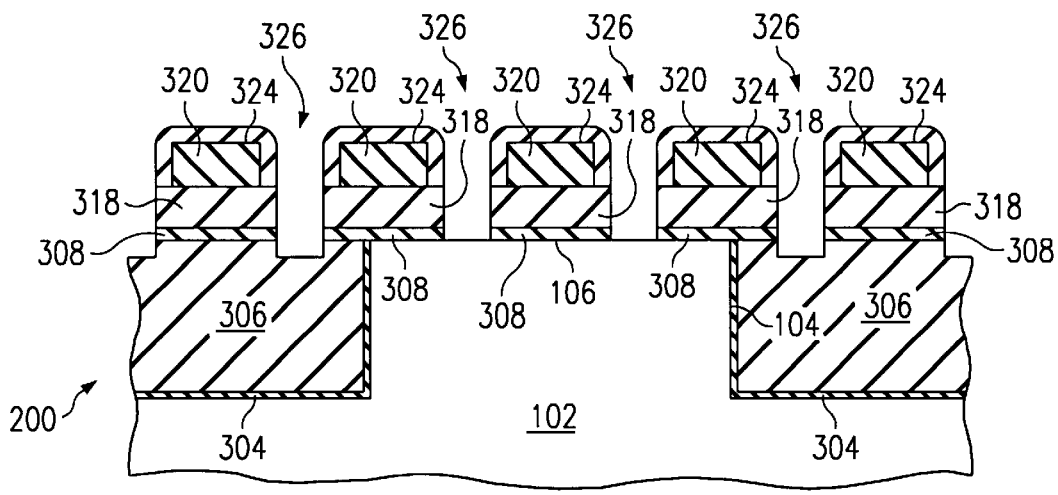
Figure 71:
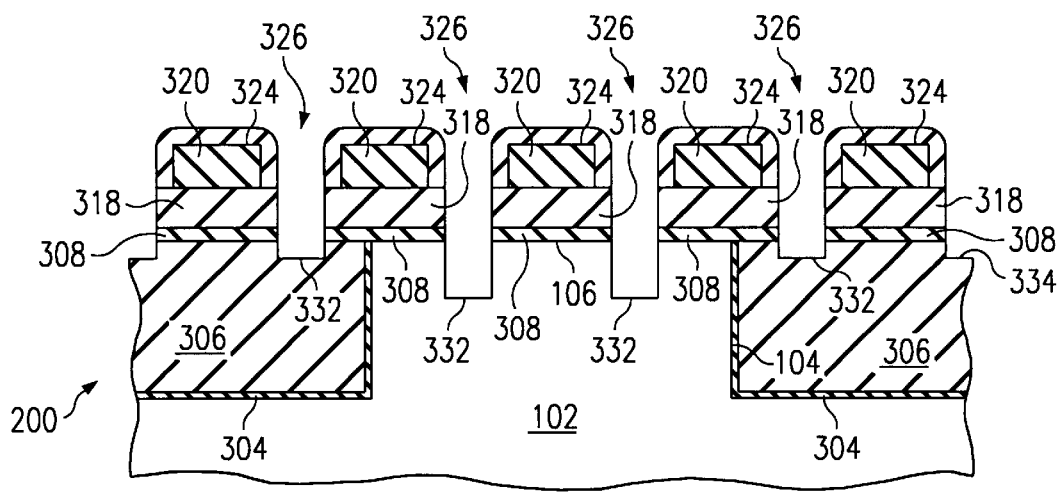

In carrying out the method of manufacture suitable for producing second embodiment 200 of the present invention, step (c) can comprise sub-steps illustrated in FIGS. 70 and 71 and discussed as follows. Continuing from the aforementioned description of FIG. 69, as shown in FIG. 70, the additional layer of $SiO_2$ 318 can be etched in the void regions 306 such that it extends to the outer surfaces 106 of the mesa-shaped active regions 104, for those of the void regions 326 located over the active regions 104, and such that the void regions 326 extend into the $SiO_2$ layer 306 somewhat inwardly of the outer surfaces 106 of the mesa-shaped active regions 104 for those of the void regions which are located away from the mesa-shaped active regions 104. With reference to FIG. 71, substrate 102 can then be etched in the area of mesa-shaped active regions 104 adjoining the void regions 326. The void regions 326 are thus extended to form word-line-receiving regions in both the mesa-shaped regions 104 and the insulation layer, such as $SiO_2$ layer 306. The word-line-receiving regions have floor portions 332. Floor portions 332 of those of the word-line-receiving regions in the mesa-shaped active regions 104 are located inwardly of the outer edge 334 of the isolation regions formed by insulation layer, such as $SiO_2$ layer 306. It will be appreciated that layer 306 can include the $SiO_2$ 308 subsequently grown onto layer 306.

Figure 39:
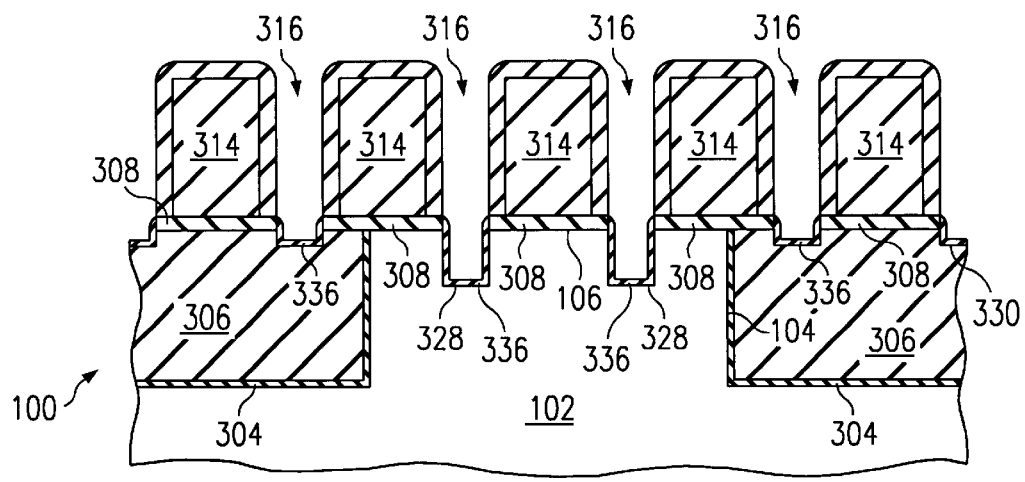
Figure 40:
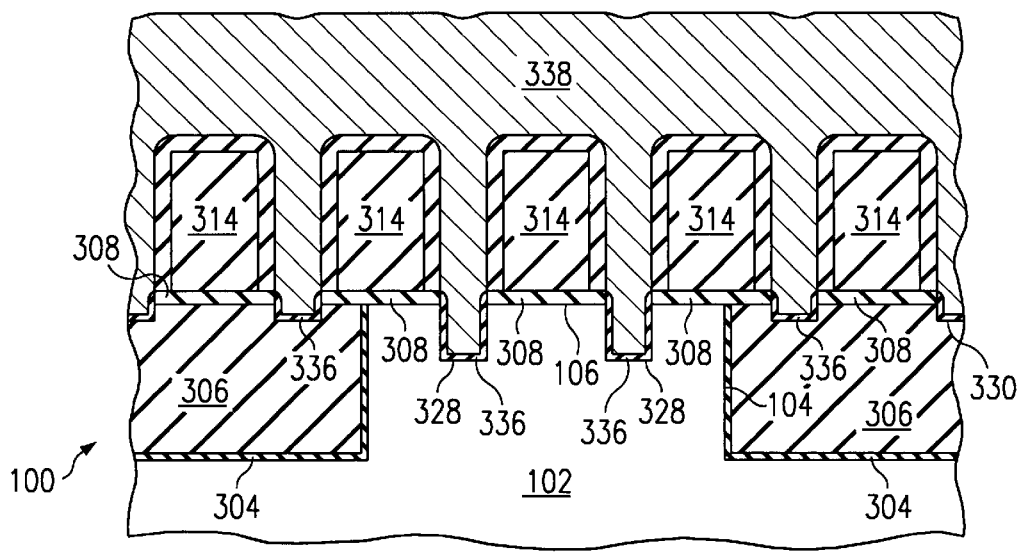
Figure 72:
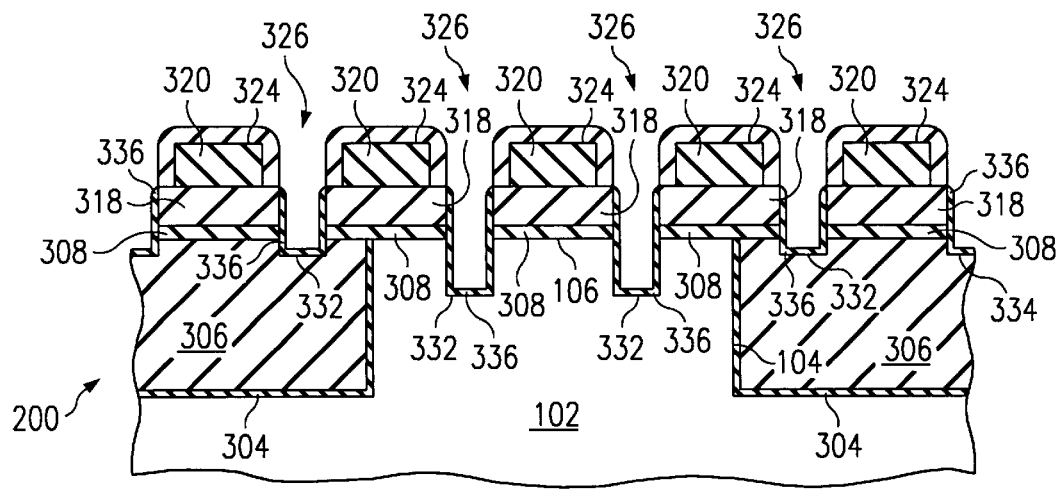

As depicted in FIGS. 39 and 72, subsequent to step (c), for the manufacturing methods for both embodiments 100, 200 of the present invention, an additional layer of $SiO_2$ 336 can be deposited to the word line receiving regions in both the mesa-shaped active regions 104 and the insulation layer such as that formed by $SiO_2$ layer 306. In the active regions, the $SiO_2$ is added as a layer of gate oxide.

Step (d) comprises placing a plurality of word lines 112 into the word-line-receiving regions formed by the void regions 316, 326.

Referring back now to FIGS. 13–19, it will be appreciated that step (d) of the present invention can comprise the sub-steps of applying an inner doped polysilicon portion 138 of each of the plurality of word lines 112 into each of the word-line-receiving regions 108; and applying an outer low-resistance portion 140 of each of plurality of word lines 112 onto each of the inner doped polysilicon portions 138. The inner doped polysilicon portions 138 can have the inner surfaces 114 of the word lines 112, while the outer low-resistance portions 140 can have the outer surfaces 116 of the word lines 112.

Referring now also to FIGS. 36–39 and 67–72, it will be appreciated that step (c) of the inventive method can include the sub-steps of extending the depth of the void regions 316, 326 which are located over the mesa-shaped active regions 104 to a first depth and extending the depth of those of the void regions 316, 326 located over the isolation regions 120 to a second depth. The second depth can be less than the first depth such that the inner surfaces 114 of the word lines 112 jog outwardly at locations 142 at a given boundary between a given one of the mesa-shaped active regions 104, isolation regions 120 and a given one of the word lines 112.

Figure 41:
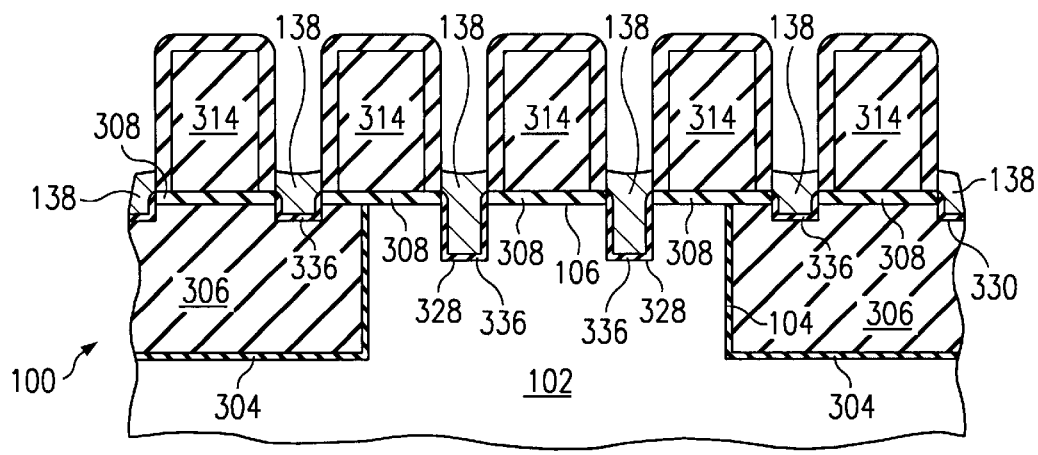

Further details will now be presented regarding method step (d) in a method, according to the present invention, for forming a first embodiment 100 of word line structure according to invention. Continuing from FIG. 39, and referring now to FIG. 40, step (d) can comprise the sub-step of applying a layer of doped polysilicon 338 into word-line-receiving regions 108 formed by void regions 316. With reference now to FIG. 41, doped polysilicon 338 can be etched back to form inner doped polysilicon portions 138 of word lines 112.

Figure 42:
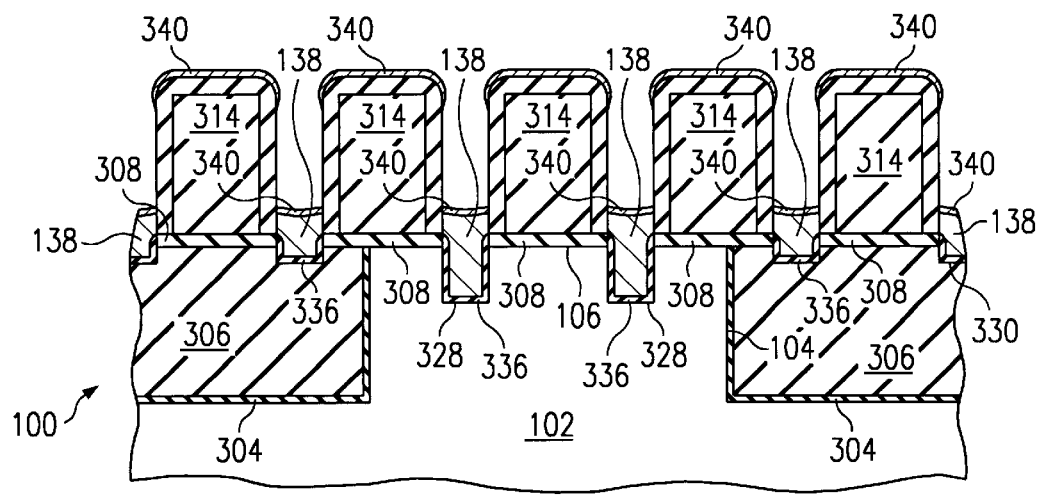
Figure 43:
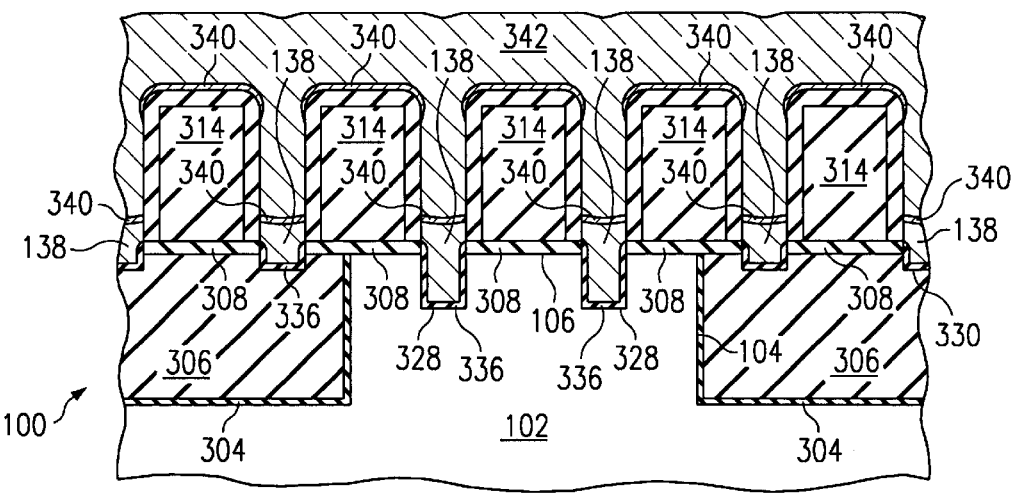
Figure 44:
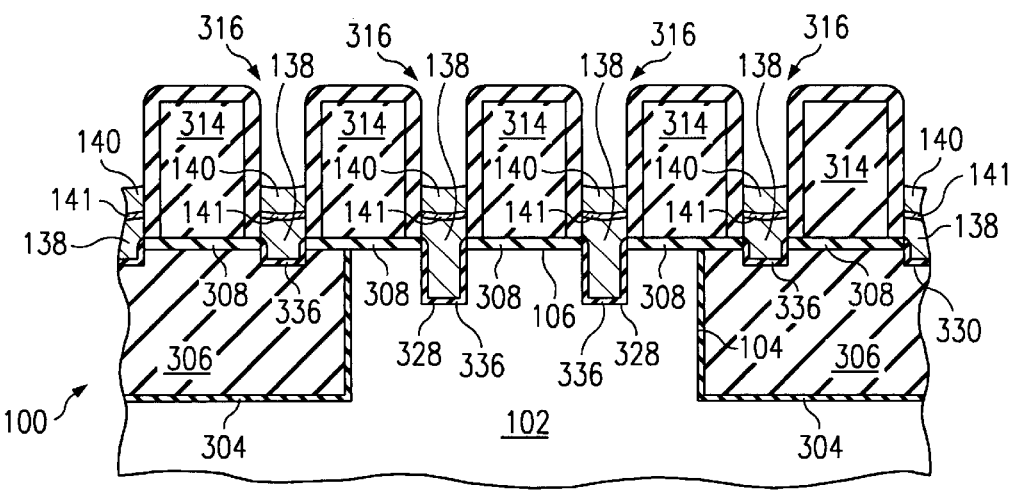
Figure 45:
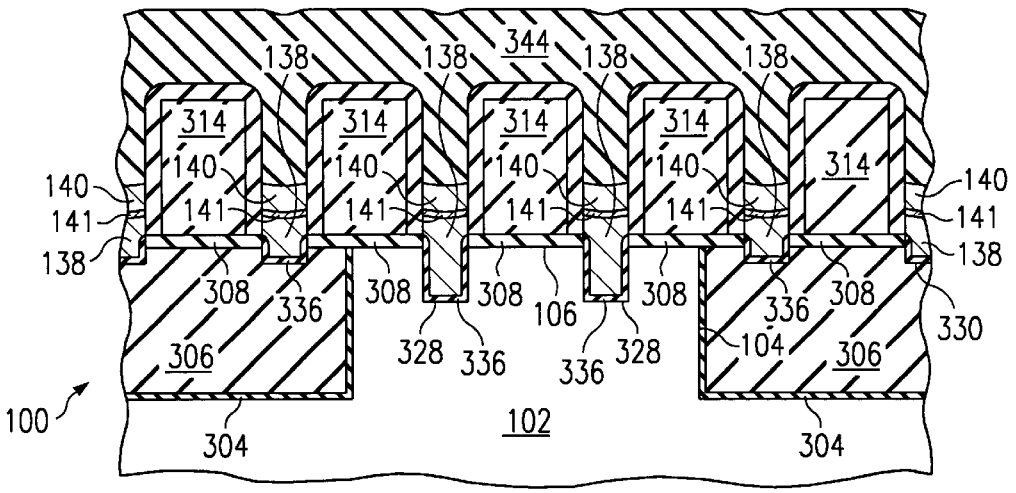

Step (d) can also comprise the sub-step of applying a layer of low-resistance material 140 over the doped polysilicon portions 138. Referring to FIG. 42, this can be accomplished, for example, by sputtering a layer of barrier metal 340 over the outer surface of the structure depicted in FIG. 41; then depositing low resistence material 342, such as metal, as depicted in FIG. 43, and then etching back the low-resistance material, such as metal 342, as shown in FIG. 44, to form the outer low-resistance portions 140 of the word lines 112. Once the low-resistance material 342 and the relevant portions of the barrier metal 340 are etched back as shown in FIG. 44, it will be appreciated that they form the previously-discussed barrier metal layer 141 and outer low-resistance portions 140 of word lines 112. It will be appreciated that void regions 316 are again exposed.

Figure 46:
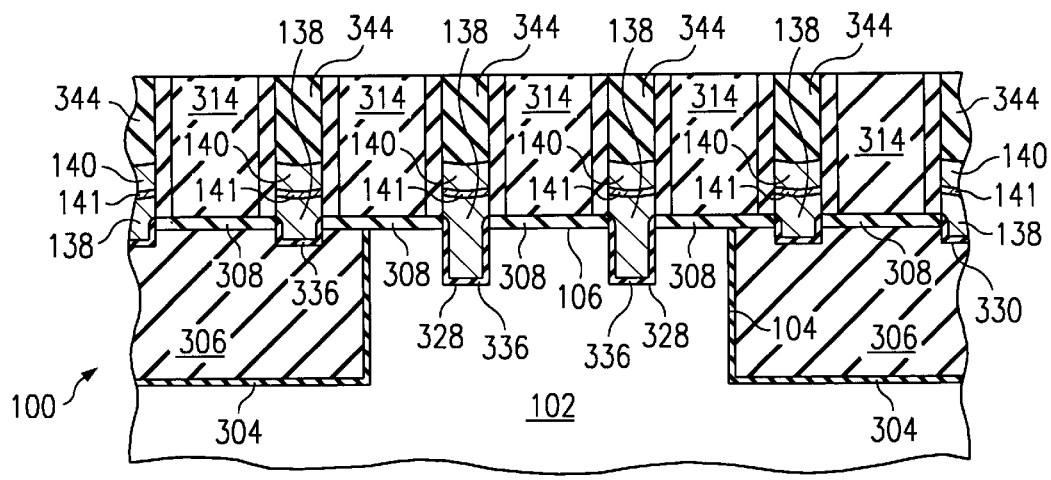

The method of the present invention can further comprise the additional steps of applying a layer of insulation 344 over the low-resistance material 342 forming low-resistance portions 140 in void regions 316. The insulation can be, for example, $SiO_2$. With reference to FIG. 46, a planarization process, such as CMP, can be performed to level the layer of insulation 344 with the tops of the $Si_3N_4$ fingers 314.

Figure 47:
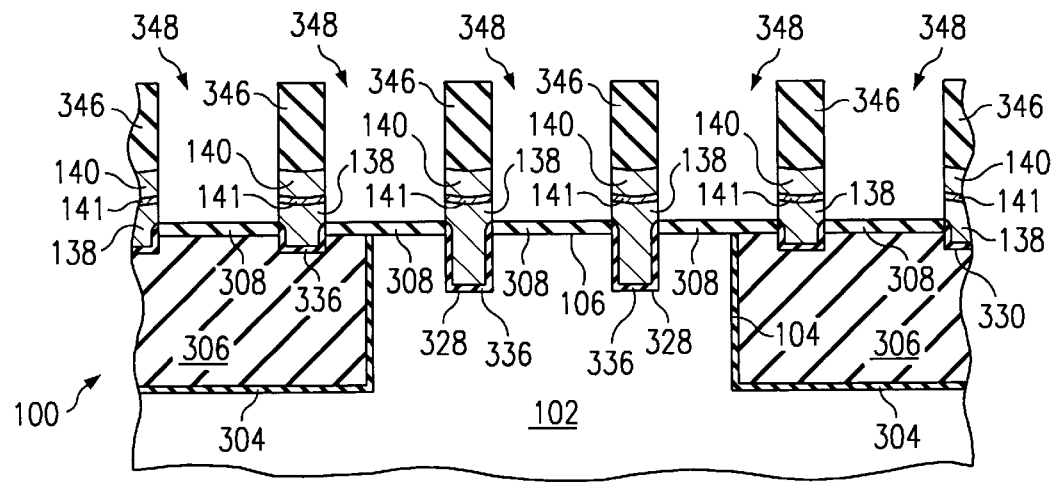
Figure 48:
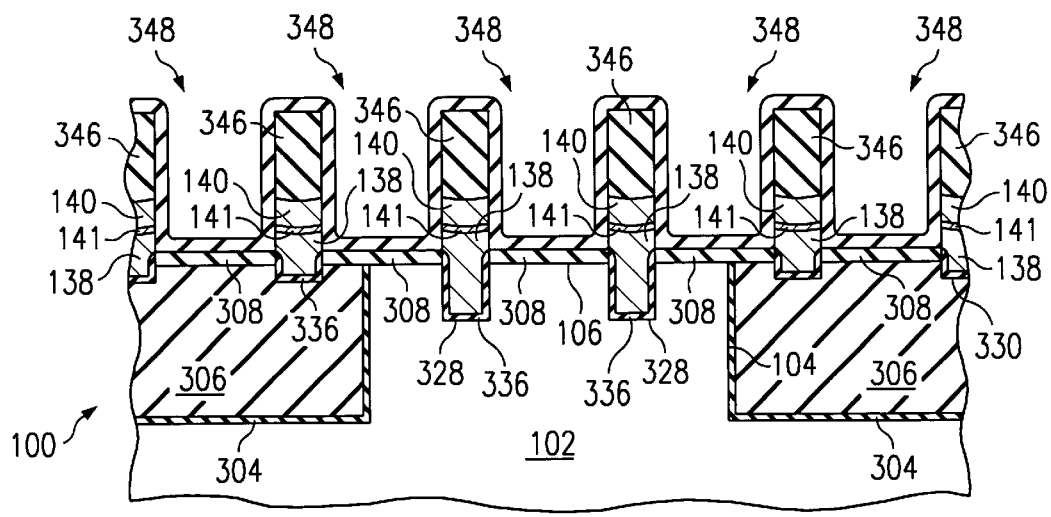
Figure 49:
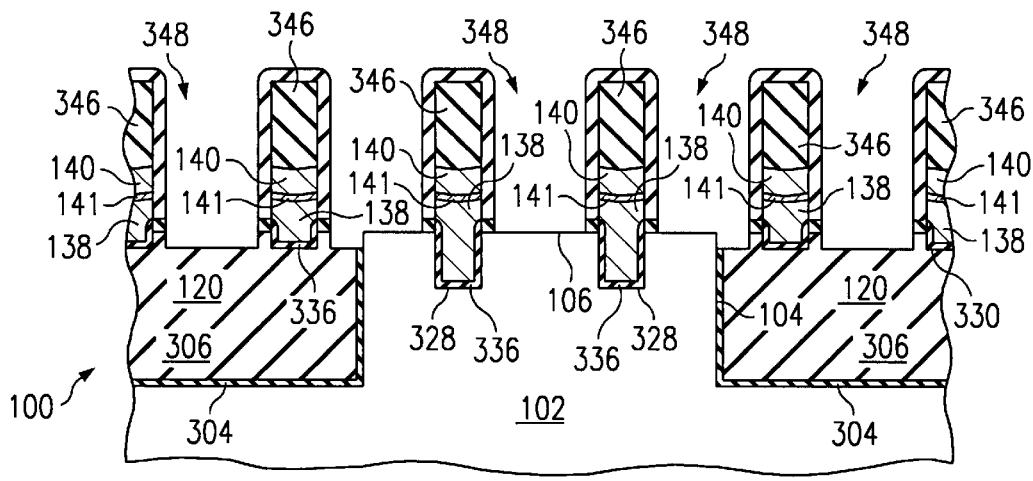

Referring to now to FIG. 47, the method can comprise the additional step of removing the $Si_3N_4$ fingers 314 so that the layer of insulation 344 forms a plurality of insulation fingers 346 which extend outwardly and which have a width coextensive with that of the low-resistance material forming outer low-resistance portions 140 of word lines 112. Insulation fingers 346 define a plurality of interstices therebetween. Referring now to FIG. 48, the method can further comprise the additional step of adding additional insulation, such as $SiO_2$, to enhance the width of the insulation fingers 346. With reference to FIG. 49, the method can further comprise the step of removing insulation material at inward portions of the interstices 348 such that the outer surfaces 106 of the mesa-shaped active regions 104 are exposed where the interstices 348 are adjacent to the mesa-shaped active regions 104. The insulation can also be removed so as to extend the interstices 348 inward of the outer surfaces 106 of the mesa-shaped active regions 104 where the interstices 348 are adjacent to the isolation regions 120.

Figure 50:
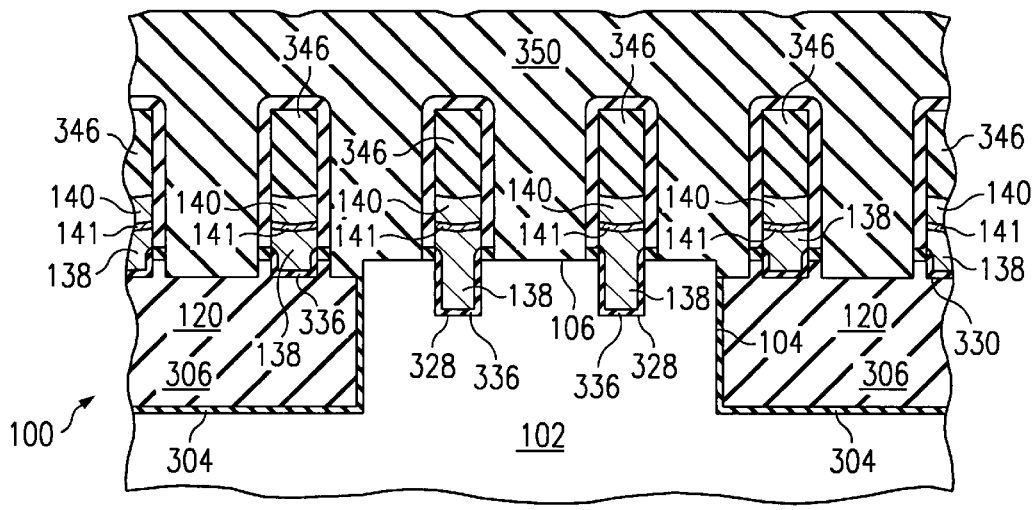
Figure 51:
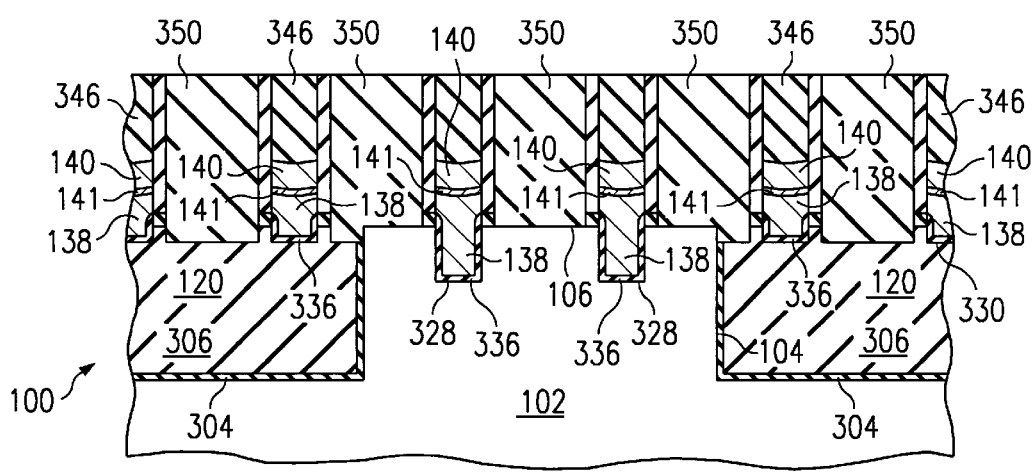

With reference to FIG. 50, the method of the present invention can further comprise filling the interstices 348 with $Si_3N_4$ 350, followed, if desired, by a planarization process, such CMP, as shown in FIG. 51.

Figure 73:
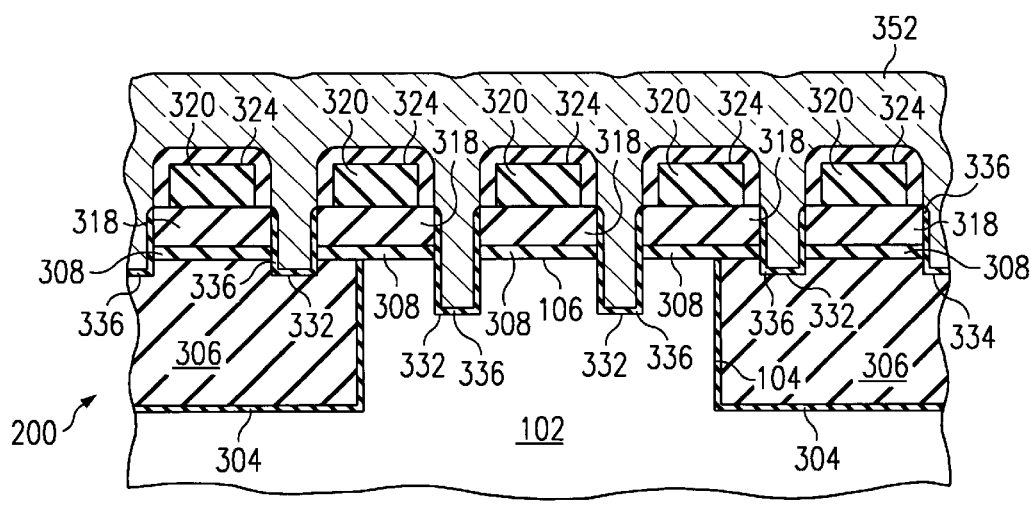
Figure 74:
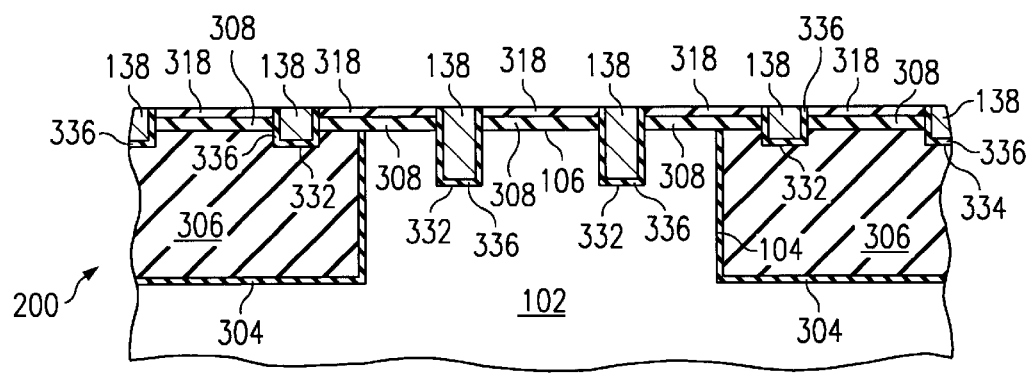

Further details will now be provided regarding the method adapted for manufacturing the second embodiment 200 of the present invention. Continuing from the above description of FIG. 72, reference should now be had to FIGS. 73 and 74. It will be appreciated that in the method for manufacturing the second embodiment 200, step (d) can comprise the sub-step of applying doped polysilicon 352 into the word-line-receiving regions formed by void regions 326. This can be followed by a planarization process, such as CMP, as depicted in FIG. 74. Doped polysilicon 352 thus forms inner doped polysilicon portions 138 of word lines 112.

Figure 75:
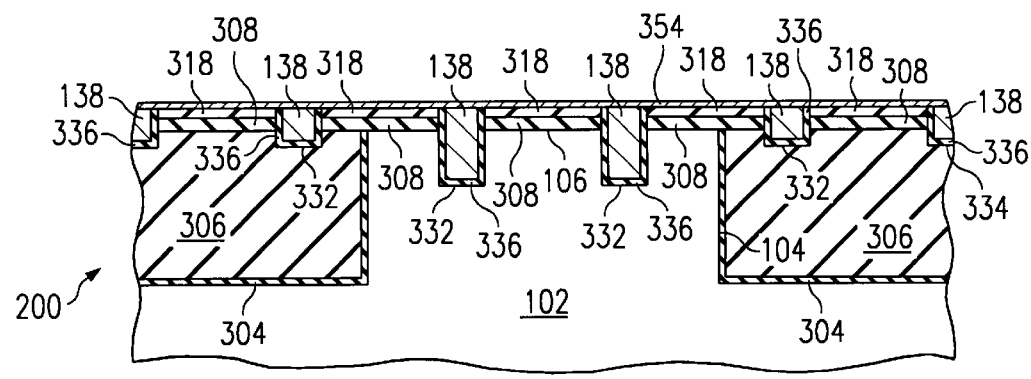
Figure 76:
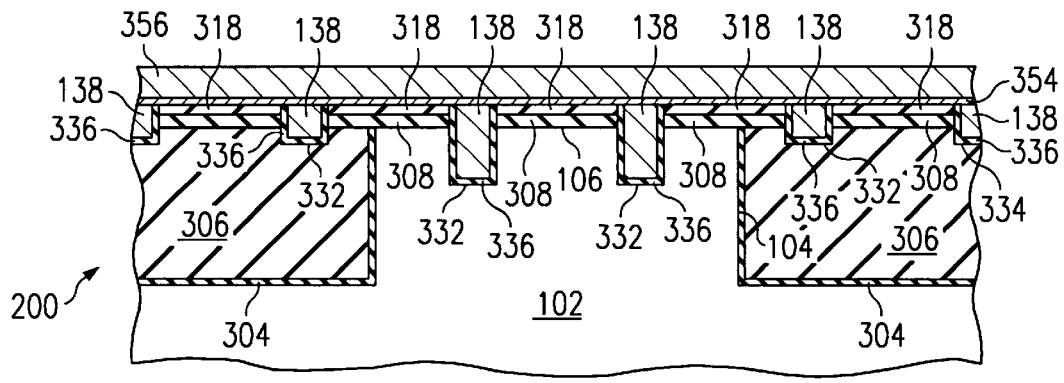
Figure 77:
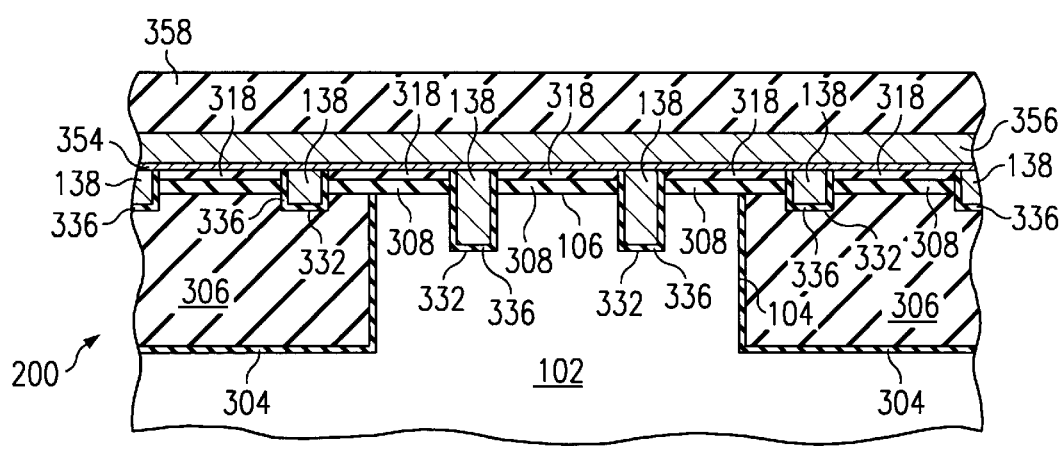
Figure 78:
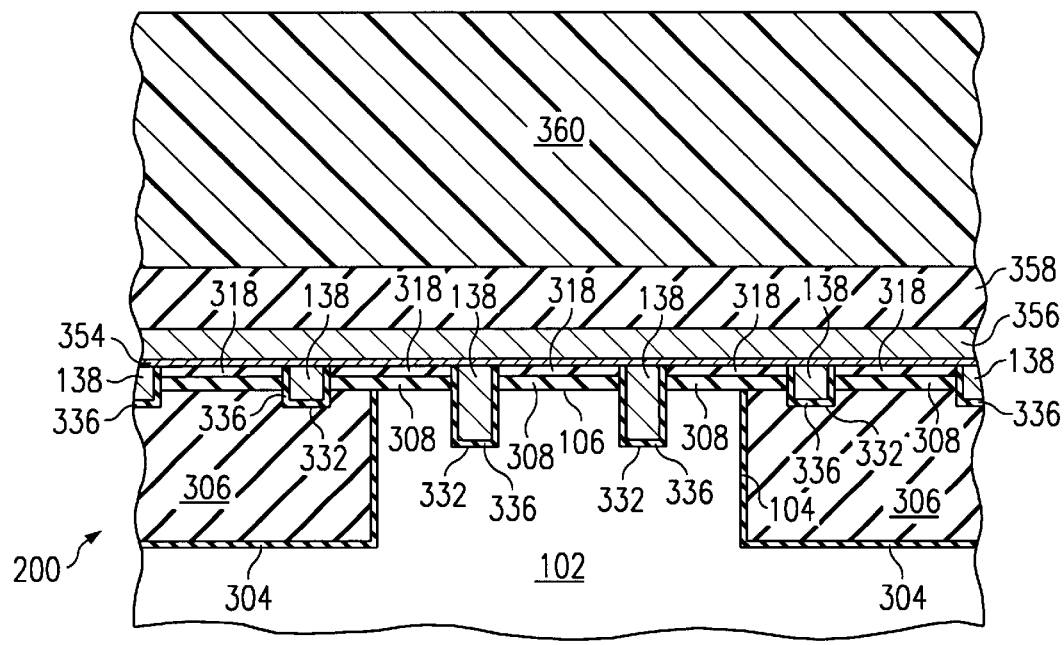
Figure 79:
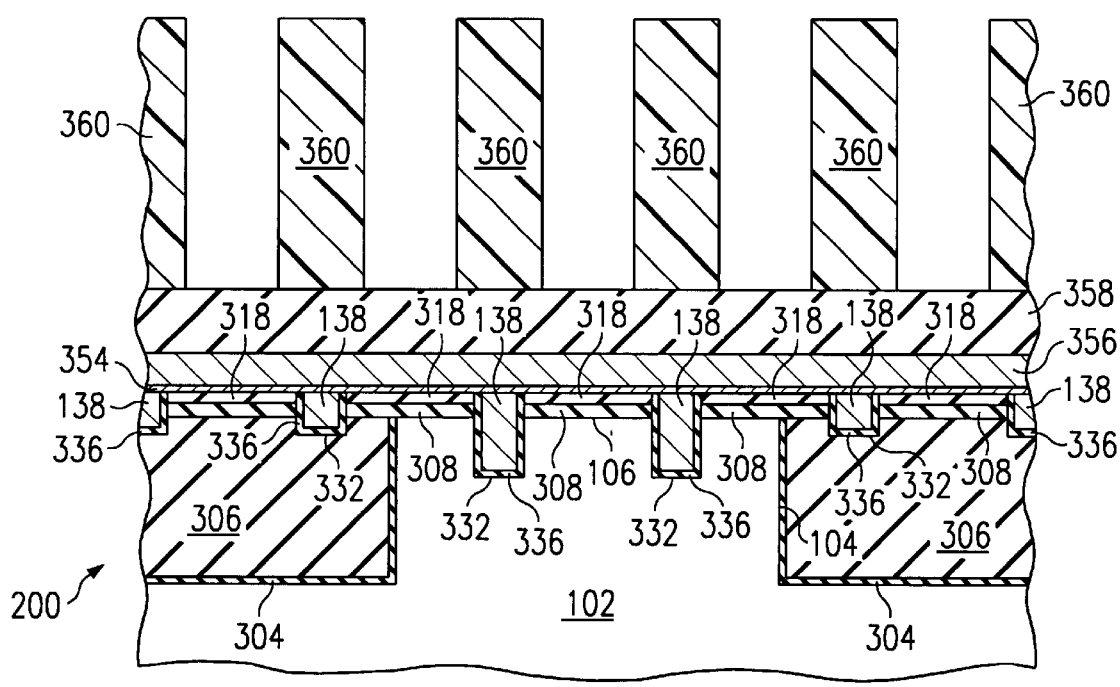
Figure 80:
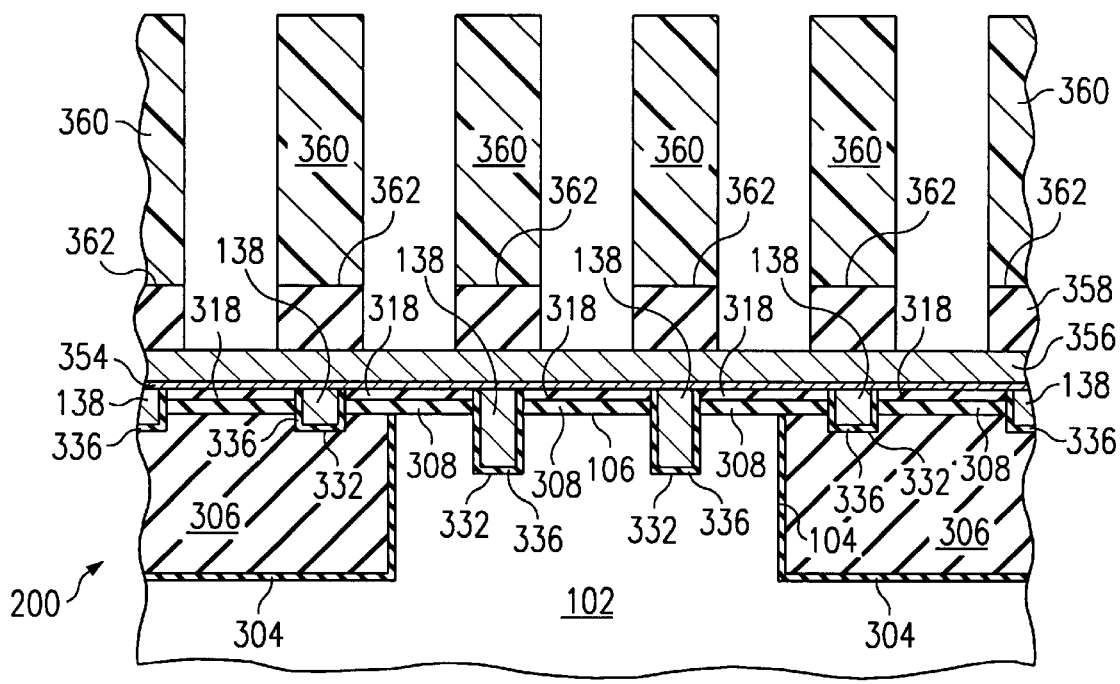
Figure 81:
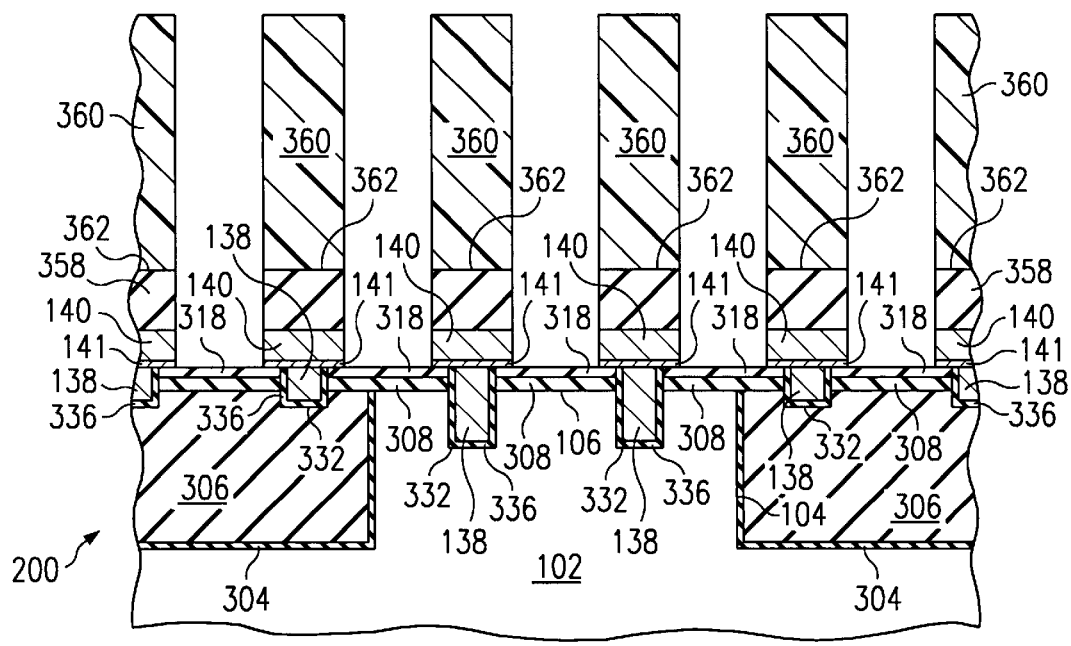
Figure 82:
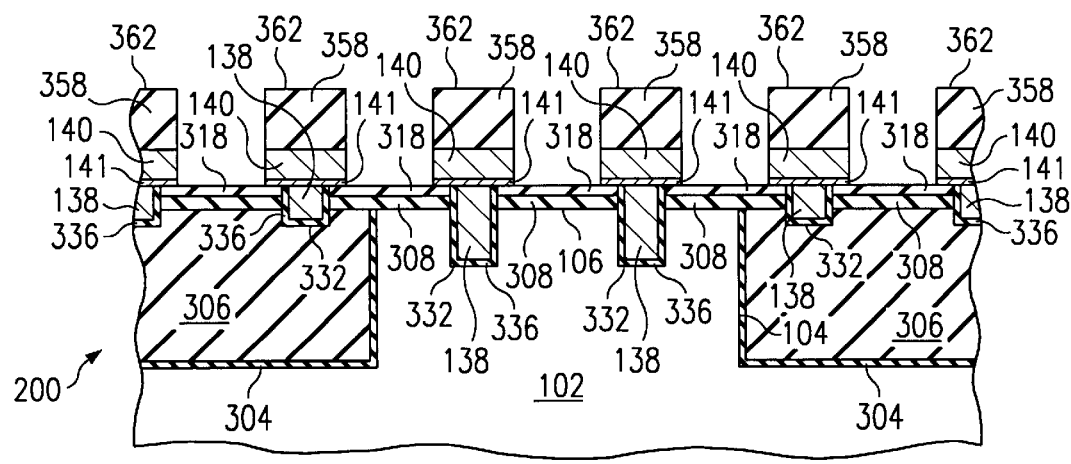
Figure 83:
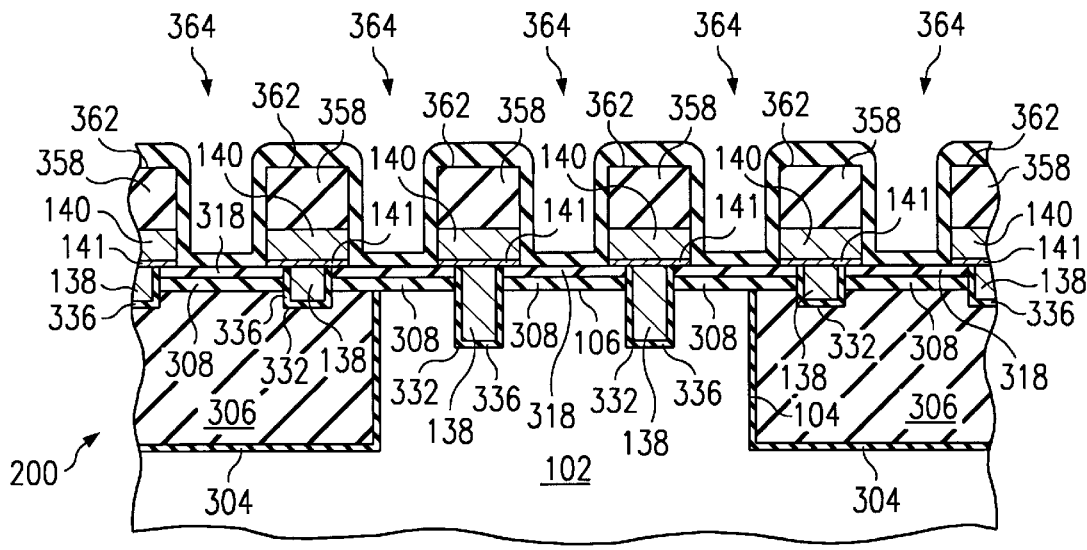
Figure 84:
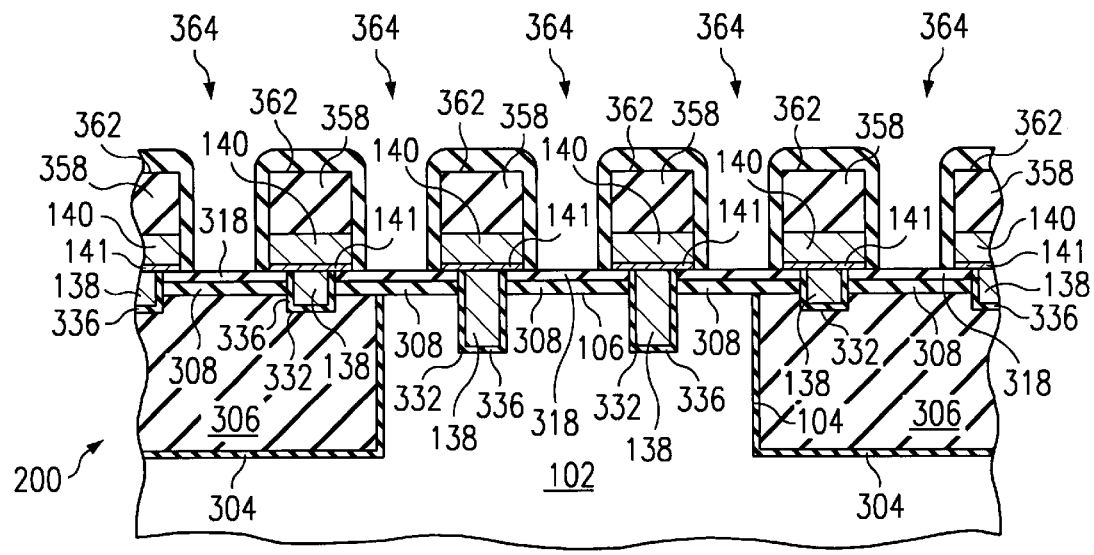
Figure 85:
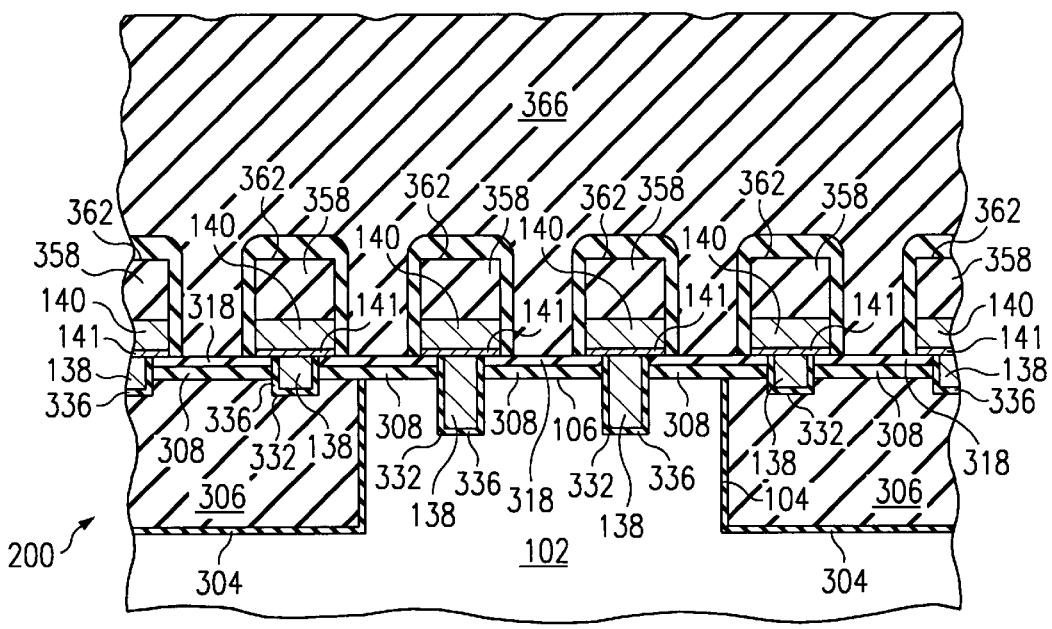

Step (d) can further comprise the sub-step of applying a layer of low-resistance material over the doped polysilicon 352 for each of the word-line-receiving regions 108. The layer of low-resistance material can have a width greater than that of its corresponding word-line-receiving region but sufficiently narrow so as not to touch an adjacent one of the layers of low-resistance material. One manner of carrying out this manufacturing sub-step will now be discussed with reference to FIGS. 75–82. As depicted in FIG. 75, a layer of barrier metal 354 can be sputtered onto the structure depicted in FIG. 74. With reference to FIG. 76, this can be followed by deposition of a layer of low-resistance material 356, such as metal. Referring to FIG. 77, a layer of $Si_3N_4$ 358 can then be deposited over the layer of low-resistance material 356. As shown in FIGS. 78 and 79, a layer of resist 360 can then be deposited over the $Si_3N_4$ 358 and can be patterned using a mask for the word lines. With reference to FIG. 80, the $Si_3N_4$ 358 can be etched to form a second plurality of $Si_3N_4$ fingers 362. With reference to FIGS. 81 and 82, the low-resistance material 356 and barrier metal 354 can be etched away in the regions between the second plurality of $Si_3N_4$ fingers 362, to form the barrier metal layer 141 and outer low-resistance portions 140 of the word lines 112. The resist 360 can then be removed.

Figure 86:
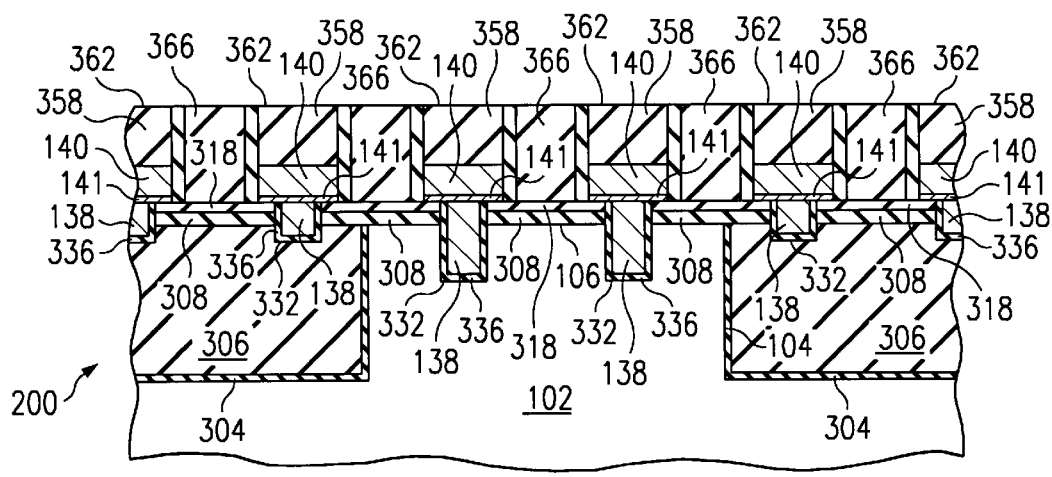

The method of manufacture according to the present invention for producing the second embodiment 200 of the present invention can also further comprise the additional steps of forming a second plurality of $Si_3N_4$ fingers 362 (after removing the first plurality of $Si_3N_4$ fingers 324). The second plurality of $Si_3N_4$ fingers can surround the layers of low-resistance material and can terminate at the insulation layer 306. The second plurality of $Si_3N_4$ fingers 362 can form a plurality of insulation-receiving gaps between themselves. The method of the present invention can then further comprise the step of filling the plurality of insulation-receiving gaps with insulation. Referring first back to FIGS. 73 and 74, the first plurality of $Si_3N_4$ fingers 324 can be removed by, for example, planarization as shown in FIG. 74. The second plurality of $Si_3N_4$ fingers 362 can be formed as shown in FIGS. 77–82, and with further reference to FIGS. 83 and 84. As shown therein, additional $Si_3N_4$ can be deposited onto the second plurality of fingers 362, and then the $Si_3N_4$ in the insulation-receiving gaps 364 can be etched such that the gaps 364 extend down to the insulation layer 306. Finally, with reference to FIGS. 85 and 86, the method of the present invention can further comprise the additional step of filling the plurality of insulation-receiving gaps 364 with insulation 366, such as $SiO_2$, followed, if desired, by a planarization process such as CMP as depicted in FIG. 86.

Certain exemplary advantages of the present invention with respect to the prior art will now be discussed. With reference to prior art structure 10 discussed above, it will be appreciated that in the present invention, the gate length $L_g$ of the transfer gate is provided by the lateral wall of the channel as the lower part of the word line 112 is embedded into the active region 104. Accordingly, a sufficient length $L_g$ can be maintained even if the width of the word line 112 is narrow in plan view. Furthermore, sufficient spacing can be kept between the word lines 112, the BLCTs and the SNCTs. This in turn permits minimization of the length of a unit cell in the cross section perpendicular to the word lines 112. The word lines can be maintained as substantially straight lines, inasmuch as they can be formed sufficiently narrow in the transfer gate portion. Advantageously, this results in minimal deformation of the actual word lines 112 from the word line mask and permits formation of the word lines 112 with minimum resolution of the stepper. Again, this contributes to attainment of minimum cell size. Having a sufficiently long $L_g$ formed by the embedded lower portion of the word line 112 in the mesa-shaped active region 104 helps to maintain a constant word line width at the transfer gate portion, and thus overcome the large variation in the transfer gate threshold voltage $V_t$ encountered in the prior art.

Further advantages obtain from the fact that the isolation region 120 is not etched off down to the inward-most portion because of the thick insulation layer 118. Accordingly, even if the BLCT or SNCT is located so a portion of its footprint is placed on the isolation region 120, the isolation region will not be etched off to the inward-most portion. This overcomes the prior art's problems with degradation of isolation performance and increase of leakage current. These effects are especially beneficial in the cell-over-bit line (COB) type of cell. With reference to the deficiencies of prior art device 42, again, essentially similar benefits as those discussed immediately above are obtained when the present invention is employed.

With reference to the prior-art trench isolation structure depicted in FIGS. 8, 12A and 12B, FIGS. 15 and 18 show that in the present invention, the upper edge of the trench isolation region is located outward of the surface of the mesa-shaped active region 104 at the boundary between the active region and the isolation region, inasmuch as the inner portions of the word lines 112 are embedded into the mesa-shaped active region 104. This solves the aforementioned problem of a "kink" in the transistor characteristic of approximately the order of magnitude of twice the threshold voltage $V_t$.

Additional benefits of the present invention include the attainment of narrow word lines 112 in plan view, which can be formed by a stepper with relatively low resolution which would be unable to pattern the width of the word lines with a typical prior process. This is because, in the present invention, the word lines can be formed by forming the $Si_3N_4$ fingers via a mask that covers the NOT of the word line regions, widening the $Si_3N_4$ fingers and then forming the word lines 112 by filling the space between the $Si_3N_4$ fingers with the word line materials. Further, with the insulation, such as $SiO_2$, formed over and on the sides of the word lines, the remaining regions can be filled with $Si_3N_4$ and the height of the $SiO_2$ and $Si_3N_4$ are the same following the method according to the invention. Utilizing the resulting structure, the etching of BLCTs or SNCTs, or any other holes, can be performed in a self-aligned fashion to the word lines 112 via a highly selective etching between the $SiO_2$ and $Si_3N_4$. Accordingly, the length of the unit cell in the cross section perpendicular to the word lines 112 can be minimized compared to the case where a non-self-aligned process is employed. Further, prior art methods have required complex planarization processes after the formation of the word lines in order to prepare the substrate for the following wiring processes. The new method does not require such specific planarization processes after the formation of the word lines 112, and is in fact ready for the following wiring processes. This results in reduced manufacturing costs.

The aforementioned dimensions can be, for example, $D_{w1}$ about 0.31 $\mu$m, $D_{w2}$ about 0.29 $\mu$m, $\Delta_{w1}$ about 0.36 $\mu$m and $\Delta_{w2}$ about 0.24 $\mu$m. The width of the word lines 112 can be about 0.16 $\mu$m, and the height of the mesa-shaped active regions 104 can be about 0.47 $\mu$m.

Although the present invention has been described in detail, it should be understood that various changes, substitutions and alterations can be made hereto without departing from the spirit and scope of the invention as defined by the appended claims.

What is claimed is:

1. A word line structure for a dynamic random access memory (DRAM) cell, said structure comprising:
   (a) a generally planar substrate;
   (b) a plurality of mesa-shaped active regions formed on said substrate and protruding outwardly a given distance therefrom, said mesa-shaped active regions having outer surfaces at said given distance from said substrate, each of said outer surfaces having two word-line-receiving regions formed therein, each of said word-line-receiving regions having a floor portion;
   (c) a plurality of substantially straight and parallel word lines each having inner and outer surfaces, two of said plurality of word lines being embedded in said two word-line-receiving regions formed in said outer surfaces of said mesa-shaped active regions with said inner surfaces of said word lines located inwardly of said outer surfaces of said mesa-shaped active regions and adjacent to said floor portions; and
   (d) an insulation layer positioned on said substrate and having an insulation layer thickness, said insulation layer forming a plurality of isolation regions between said plurality of mesa-shaped active regions, said isolation regions having outer edges located outwardly from said floor portions of said word-line-receiving regions formed in said outer surfaces of said mesa-shaped active regions at a given boundary formed by a given one of said mesa-shaped active regions, a given one of said isolation regions, and a given one of said word lines.

2. The word line structure of claim 1, wherein:
   said plurality of mesa-shaped active regions are arranged in a pattern of rows and columns on said substrate with said word lines running generally perpendicular to said rows and parallel to said columns;
   each active region in given row is separated from an adjacent active region in said row by an isolation region;
   each active region in a given column is separated from an adjacent active region in said column by an isolation region such that said rows and columns form a staggered structure; and
   said word lines run in pairs, passing alternatively through individual ones of said mesa-shaped regions and individual ones of said isolation regions.

3. The word line structure of claim 2, wherein:
   said pairs of word lines are jogged such that they are spaced apart a first distance at said mesa-shaped active regions and a second distance at said isolation regions; and
   said second dimension is less than first dimension such that adjacent mesa-shaped active regions in a given row can be spaced closer together without touching intermediate pairs of word lines in an isolation region between said adjacent mesa-shaped active regions.

4. The word line structure of claim 2, further comprising a layer of gate oxide material located between said word lines and said word-line-receiving regions, said gate oxide material being in communication with said insulation layer.

5. The word line structure of claim 2, wherein said word lines are formed with inner doped polysilicon portions having said inner surfaces and outer low-resistance portions having said outer surfaces.

6. The word line structure of claim 5, wherein said word lines:
   have a first depth over said mesa-shaped active regions, said first depth extending between said inner and outer surfaces; and
   have a second depth over said isolation regions, said second depth extending between said inner and outer surfaces and being less than said first depth such that said inner surfaces of said word lines jog outwardly at said given boundaries, as viewed when moving from a given one of said mesa-shaped active regions to a given one of said isolation regions.

7. The word line structure of claim 1, wherein said insulation layer thickness is such that said insulation layer generally terminates in a main outer surface which is located just inward of said outer surfaces of said mesa-shaped active regions, said word line structure further comprising:
   a layer of gate oxide material located between said word lines and said word-line-receiving regions, said gate oxide material being in communication with said insulation layer;
   a plurality of finger portions integral with said insulation layer and extending outwardly therefrom, said finger portions enclosing said word lines and defining a plurality of $Si_3N_4$-receiving cavities therebetween; and
   a layer of $Si_3N_4$ located in said $Si_3N_4$-receiving cavities.

8. The word line structure of claim 1, wherein:
   said insulation layer thickness is such that said insulation layer generally terminates in a main outer surface which is located just outward of said outer surfaces of said mesa-shaped active regions;
   said word lines are formed with inner doped polysilicon portions having said inner surfaces and outer low-resistance portions having said outer surfaces, said inner doped polysilicon portions extending outwardly to a level even with said main outer surface of said insulation layer; and
   said insulation layer is formed with a plurality of outwardly extending fingers which extend outward beyond said main outer surface of said insulation layer, said outwardly extending fingers being located between said word lines and forming $Si_3N_4$-receiving cavities therebetween;
   said word line structure further comprising:
   a layer of gate oxide material located between said word lines and said word-line-receiving regions, said gate oxide material being in communication with said insulation layer; and
   a layer of $Si_3N_4$ located in said $Si_3N_4$-receiving cavities and surrounding said outer low-resistance portions of said word lines.

* * * * *